US012652790B2

(12) United States Patent
Huang

(10) Patent No.: US 12,652,790 B2
(45) Date of Patent: Jun. 9, 2026

(54) SEMICONDUCTOR DEVICE WITH PERIPHERAL GATE STRUCTURE AND METHOD FOR FABRICATING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 363 days.

(21) Appl. No.: 18/374,154

(22) Filed: Sep. 28, 2023

(65) Prior Publication Data

US 2024/0130103 A1 Apr. 18, 2024

Related U.S. Application Data

(62) Division of application No. 17/956,127, filed on Sep. 29, 2022, now Pat. No. 12,432,904.

(51) Int. Cl.
H10D 30/00 (2025.01)
H10B 12/00 (2023.01)

(52) U.S. Cl.
CPC ............. H10B 12/09 (2023.02); H10B 12/34 (2023.02); H10B 12/50 (2023.02)

(58) Field of Classification Search
CPC ........ H10B 12/09; H10B 12/34; H10B 12/50; H10B 12/053
See application file for complete search history.

(56) References Cited

U.S. PATENT DOCUMENTS

| | | | | |
|---|---|---|---|---|
| 2006/0097314 | A1 | 5/2006 | Uchiyama | |
| 2007/0052013 | A1* | 3/2007 | Kim ..................... | H10B 12/053 |
| | | | | 257/E27.048 |
| 2008/0203455 | A1* | 8/2008 | Jang ..................... | H10D 64/513 |
| | | | | 257/E21.177 |

(Continued)

FOREIGN PATENT DOCUMENTS

| | | |
|---|---|---|
| TW | 202414837 A | 4/2024 |
| TW | 202414843 A | 4/2024 |

OTHER PUBLICATIONS

Office Action and and the search report mailed on Jun. 4, 2025 related to U.S. Appl. No. 17/956,127.

(Continued)

*Primary Examiner* — Samuel Park
(74) *Attorney, Agent, or Firm* — Xuan Zhang

(57) ABSTRACT

The present application discloses a semiconductor device and a method for fabricating the semiconductor device. The semiconductor device includes a substrate including an array area and a peripheral area; and a peripheral gate structure including: a peripheral gate dielectric layer inwardly positioned in the peripheral area of the substrate and including a U-shaped cross-sectional profile; a peripheral gate conductor including a bottom portion positioned on the peripheral gate dielectric layer and a neck portion positioned on the bottom portion; and a peripheral gate capping layer positioned on the peripheral gate dielectric layer and the bottom portion, and surrounding the neck portion. A top surface of the peripheral gate capping layer and a top surface of the neck portion are substantially coplanar.

5 Claims, 25 Drawing Sheets

(56) References Cited

U.S. PATENT DOCUMENTS

| | | | |
|---|---|---|---|
| 2009/0127609 A1* | 5/2009 | Han | H10P 95/906 |
| | | | 257/311 |
| 2019/0139963 A1 | 5/2019 | Hong et al. | |
| 2021/0091086 A1 | 3/2021 | Hong et al. | |
| 2022/0037508 A1 | 2/2022 | Kim et al. | |
| 2022/0122986 A1 | 4/2022 | Jang et al. | |
| 2022/0231027 A1 | 7/2022 | Seong et al. | |

OTHER PUBLICATIONS

Office Action and search report dated on Jul. 5, 2024 related to Taiwanese Application No. 112112005.
Office Action and search report dated on Jul. 5, 2024 related to Taiwanese Application No. 112148274.

* cited by examiner

<u>10</u>

Z

SEMICONDUCTOR DEVICE WITH PERIPHERAL GATE STRUCTURE AND METHOD FOR FABRICATING THE SAME

CROSS-REFERENCE TO RELATED APPLICATION

This application is a divisional application of U.S. Non-Provisional application Ser. No. 17/956,127 filed Sep. 29, 2022, which is incorporated herein by reference in its entirety.

TECHNICAL FIELD

The present disclosure relates to a semiconductor device and a method for fabricating the semiconductor device, and more particularly, to a semiconductor device with a peripheral gate structure and a method for fabricating the semiconductor device with the peripheral gate structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including an array area and a peripheral area; and a peripheral gate structure including: a peripheral gate dielectric layer inwardly positioned in the peripheral area of the substrate and including a U-shaped cross-sectional profile; a peripheral gate conductor including a bottom portion positioned on the peripheral gate dielectric layer and a neck portion positioned on the bottom portion; and a peripheral gate capping layer positioned on the peripheral gate dielectric layer and the bottom portion, and surrounding the neck portion. A top surface of the peripheral gate capping layer and a top surface of the neck portion are substantially coplanar.

Another aspect of the present disclosure provides a semiconductor device including a substrate including an array area and a peripheral area; a peripheral gate structure including: a peripheral gate dielectric layer inwardly positioned in the peripheral area of the substrate and including a U-shaped cross-sectional profile; a peripheral gate conductor including a bottom portion positioned on the peripheral gate dielectric layer and a neck portion positioned on the bottom portion; and a peripheral gate capping layer positioned on the peripheral gate dielectric layer and the bottom portion, and surrounding the neck portion; and an array gate structure positioned in the array area of the substrate. A top surface of the peripheral gate capping layer and a top surface of the neck portion are substantially coplanar. A width of the peripheral gate structure is greater than a width of the array gate structure.

Another aspect of the present disclosure provides a method for fabricating a semiconductor device including providing a substrate including an array area and a peripheral area; forming a peripheral trench in the peripheral area of the substrate and forming an array trench in the array area of the substrate; forming a dummy filler layer to completely fill the peripheral trench; recessing the dummy filler layer; forming an array gate structure in the array trench and forming a peripheral gate capping layer on the dummy filler layer and in the peripheral trench, wherein the peripheral gate capping layer includes a first opening exposing the dummy filler layer; forming a sacrificial layer on the substrate and forming a second opening along the sacrificial layer to expose the dummy filler layer; selectively removing the dummy filler layer in the peripheral trench; and forming a peripheral gate dielectric layer in the peripheral trench; forming a peripheral gate conductor on the peripheral gate dielectric layer, in the first opening, and in the second opening; and removing the sacrificial layer. The peripheral gate dielectric layer, the peripheral gate conductor, and the peripheral gate capping layer configure a peripheral gate structure.

Due to the design of the semiconductor device of the present disclosure, the peripheral gate structure and the plurality of array gate structures may be both formed in the substrate by employing the dummy filler layer. The complexity of fabricating the semiconductor device including the peripheral gate structure and the plurality of array gate structures may be reduced by employing the dummy filler layer. As a result, the cost of fabricating the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
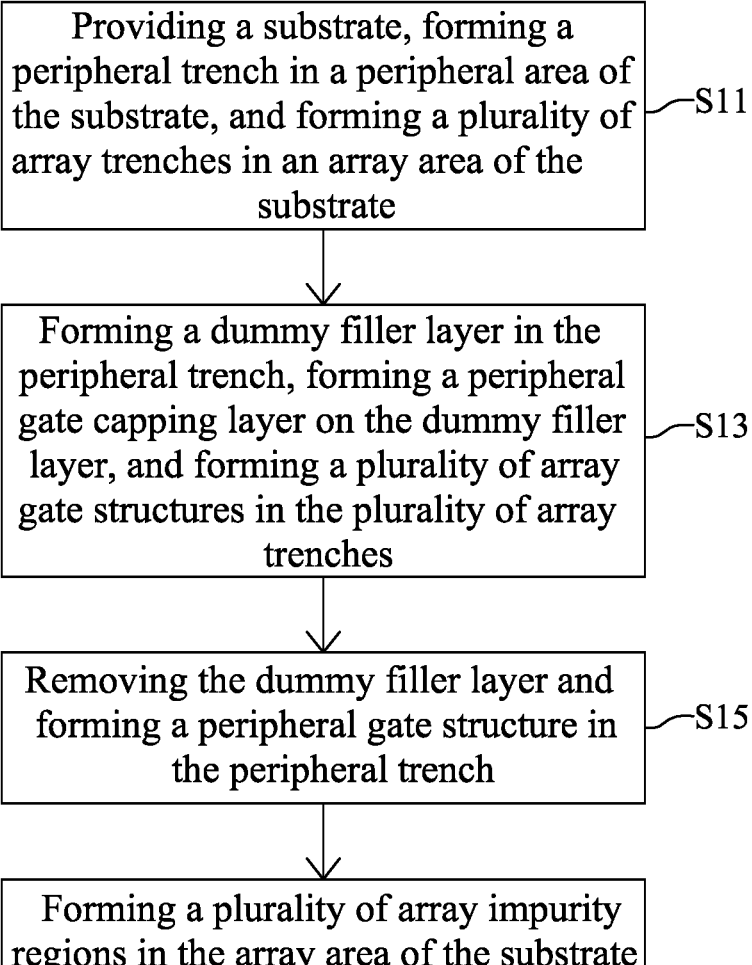
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 8 illustrate, in schematic cross-sectional view diagrams, part of a flow for fabricating the semiconductor device 1A in accordance with one embodiment of the present disclosure. FIG. 9 is a chart showing an example of process conditions for forming a layer of capping material 507 of the semiconductor device 1A in accordance with one embodiment of the present disclosure. FIGS. 10 to 21 illustrate, in schematic cross-sectional view diagrams, part of the flow for fabricating the semiconductor device 1A in accordance with one embodiment of the present disclosure.

Figure 2:
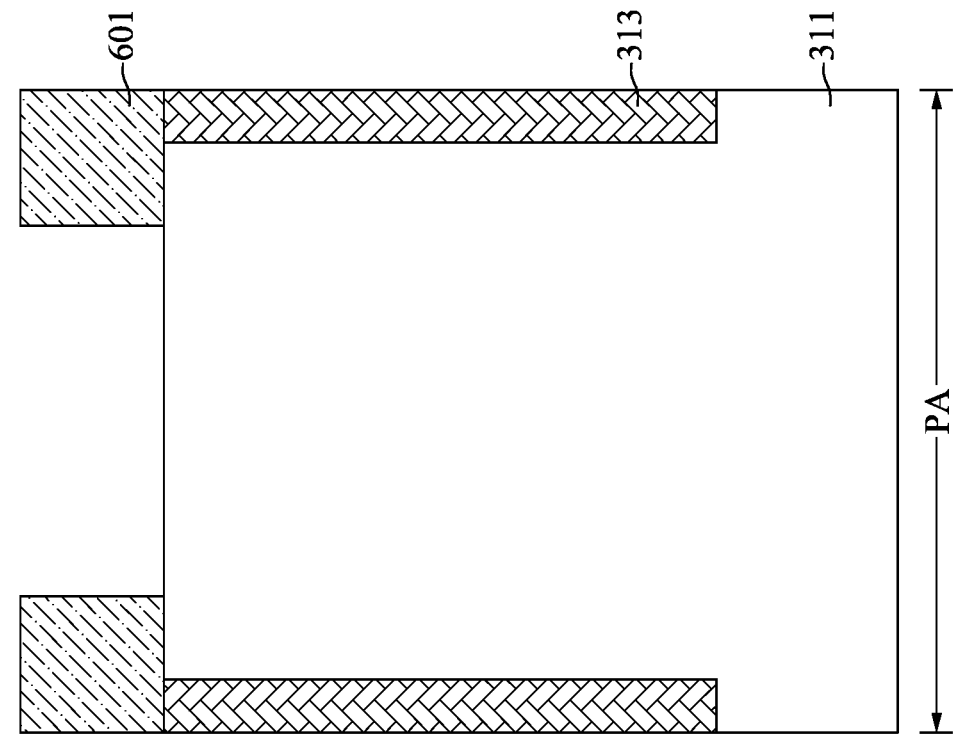
FIGS. 2 to 8 illustrate, in schematic cross-sectional view diagrams, part of a flow for fabricating the semiconductor device in accordance with one embodiment of the present disclosure.
Figure 2:
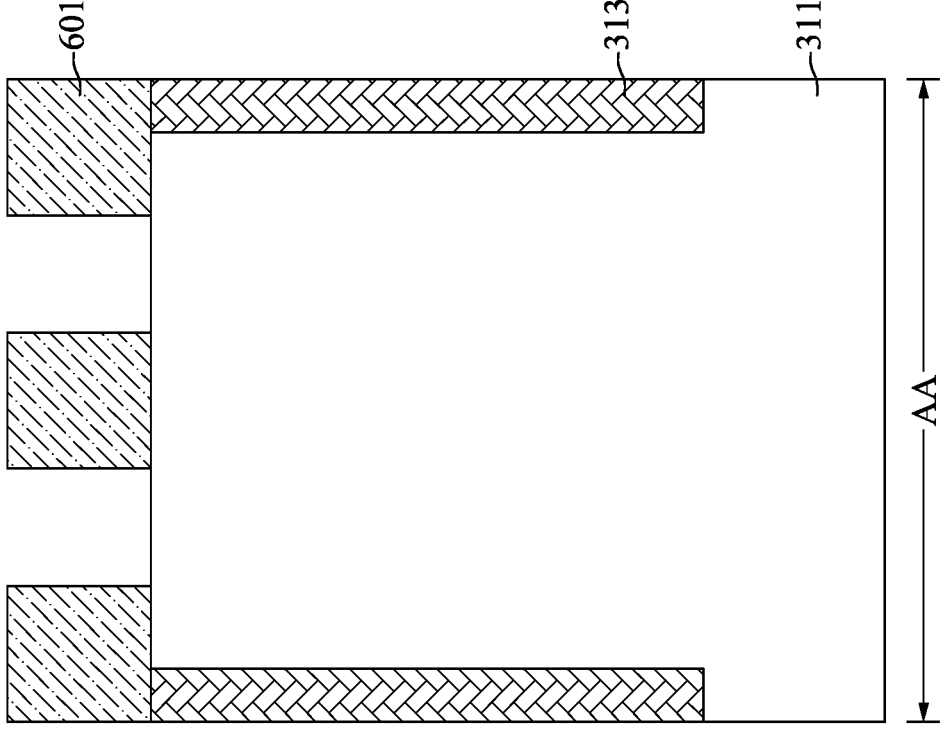
Figure 3:
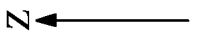

With reference to FIGS. 1 to 3, at step S11, a substrate 311 may be provided, a peripheral trench TR1 may be formed in a peripheral area PA of the substrate 311, and a plurality of array trenches TR2 may be formed in an array area AA of the substrate 311.

With reference to FIG. 2, the substrate 311 may be a semiconductor substrate, such as a bulk semiconductor substrate, a Semiconductor-On-Insulator (SOI) substrate, or the like, which may be doped (e.g., with a p-type or an n-type dopant) or undoped. The substrate 311 may be a part of wafer, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon substrate or a glass substrate. In some embodiments, the insulator layer may have a thickness between about 10 nm and about 200 nm. The insulator layer may eliminate leakage current between adjacent elements in the substrate 311 and reduce parasitic capacitance associated with source/ drains. Other substrates such as a multi-layered or gradient substrate may also be used. In some embodiments, the semiconductor material of the substrate 311 may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the substrate 311 may include the array area AA and the peripheral area PA. In some embodiments, the peripheral area PA may be next to the array area AA. In some embodiments, the array area AA may be the center region of a die in a top-view perspective and the peripheral area PA may surround the array area AA.

It should be noted that the array area AA may comprise a portion of the substrate 311 and a space above the portion of the substrate 311. Describing an element as being disposed on the array area AA means that the element is disposed on a top surface of the portion of the substrate 311. Describing an element as being disposed in the array area AA means that the element is disposed in the portion of the substrate 311; however, a top surface of the element may be even with the top surface of the portion of the substrate 311. Describing an element as being disposed above (or over) the array area AA means that the element is disposed above (or over) the top surface of the portion of the substrate 311. Accordingly, the peripheral area PA may comprise another portion of the substrate 311 and a space above the other portion of the substrate 311.

With reference to FIG. 2, a series of deposition processes may be performed to deposit a pad oxide layer (not shown for clarity) and a pad nitride layer (not shown for clarity) on the substrate 311. A photolithography process may be performed to define the position of the isolation layer 313. After the photolithography process, an etch process, such as an anisotropic dry etch process, may be performed to form trenches penetrating through the pad oxide layer, the pad nitride layer, and extending to the substrate 311. An insulating material such as silicon oxide, silicon nitride, silicon oxynitride, or silicon nitride oxide may be deposited into the trenches and a planarization process, such as chemical mechanical polishing, may be subsequently performed to remove excess filling material until a top surface of the substrate 311 is exposed so as to form the isolation layer 313. The top surface of the isolation layer 313 and the top surface of the substrate 311 may be substantially coplanar.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 2, a first mask layer 601 may be formed on the substrate 311. In some embodiments, the first mask layer 601 may be a photoresist layer. The first mask layer 601 may include the pattern of the peripheral trench TR1 and the plurality of array trenches TR2.

With reference to FIG. 3, an etch process may be performed using the first mask layer 601 as the mask to remove portions of the substrate 311. The etch rate ratio of the substrate 311 to the first mask layer 601 may be between about 100:1 and about 1.05:1, between about 15:1 and about 2:1, or between about 10:1 and about 2:1 during the etch process. In some embodiments, the bottom surface TBS1 of the peripheral trench TR1 and the bottom surfaces TBS2 of the plurality of array trenches TR2 may be at the same vertical level VL1. In some embodiments, the bottom surface TBS1 of the peripheral trench TR1 may be at a vertical level higher than the bottom surfaces of the plurality of array trenches TR2 (not shown in FIG. 3 for clarity). After the formation of the peripheral trench TR1 and the plurality of array trenches TR2, the first mask layer 601 may be removed by, for example, an ashing process.

With reference to FIG. 3, the width W1 of the peripheral trench TR1 may be greater than the width W2 of the plurality of array trenches TR2. In some embodiments, the width ratio of the width W1 of the peripheral trench TR1 to the width W2 of the plurality of array trenches TR2 may be between about 8 and about 2 or between about 6 and about 2.5.

With reference to FIG. 1 and FIGS. 4 to 13, at step S13, a dummy filler layer 501 may be formed in the peripheral trench TR1, a peripheral gate capping layer 130 may be formed on the dummy filler layer 501, and a plurality of array gate structures 200 may be formed in the plurality of array trenches TR2.

Figure 4:
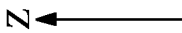
Figure 4:
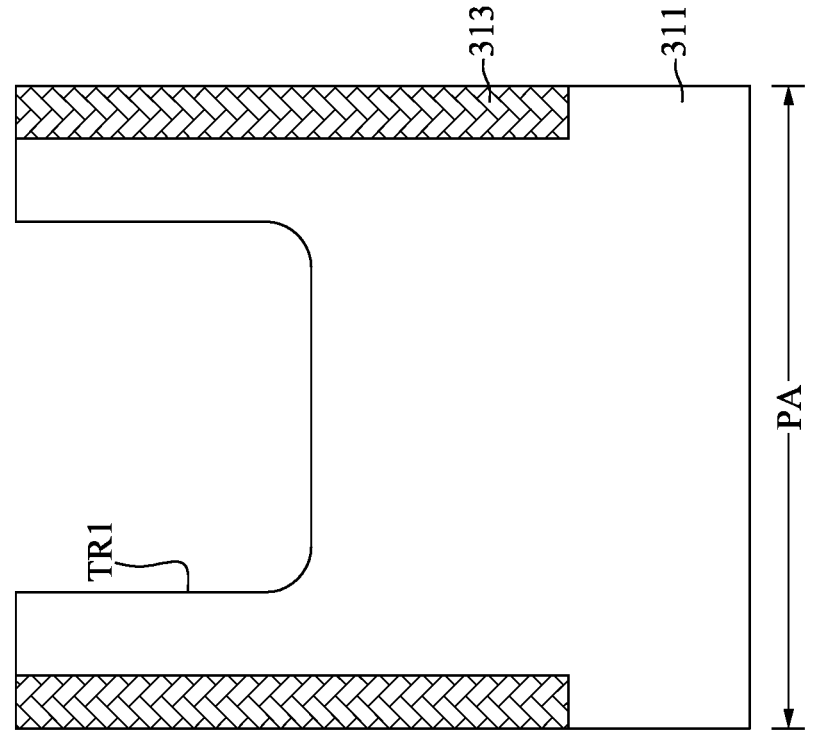
Figure 4:
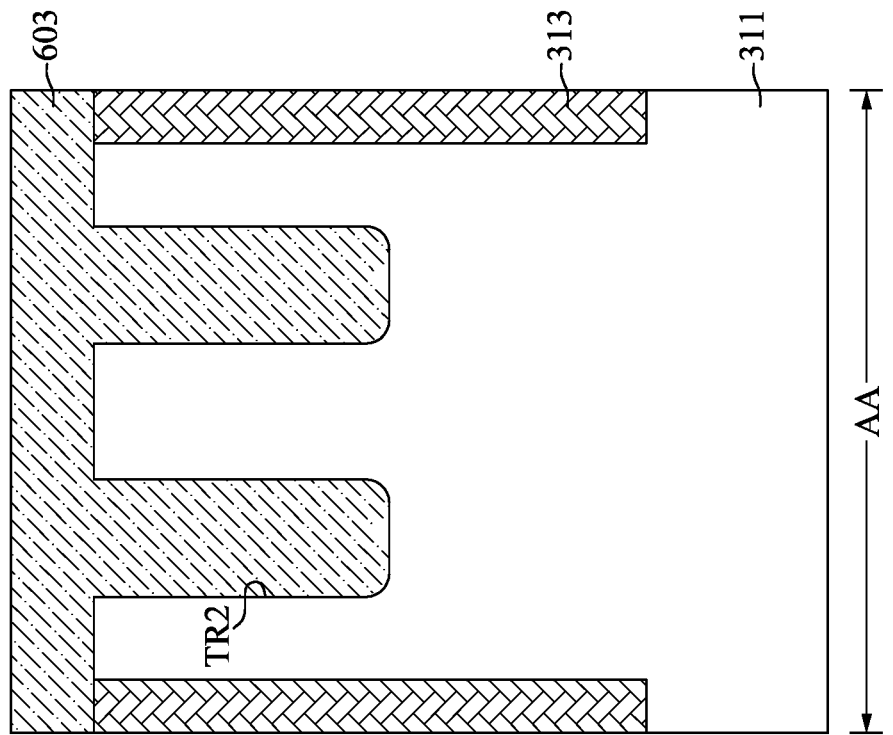

With reference to FIG. 4, a second mask layer 603 may be formed to completely fill the plurality of array trenches TR2 and cover the array area AA of the substrate 311. In some embodiments, the second mask layer 603 may be a photoresist layer.

Figure 5:
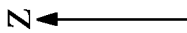
Figure 5:
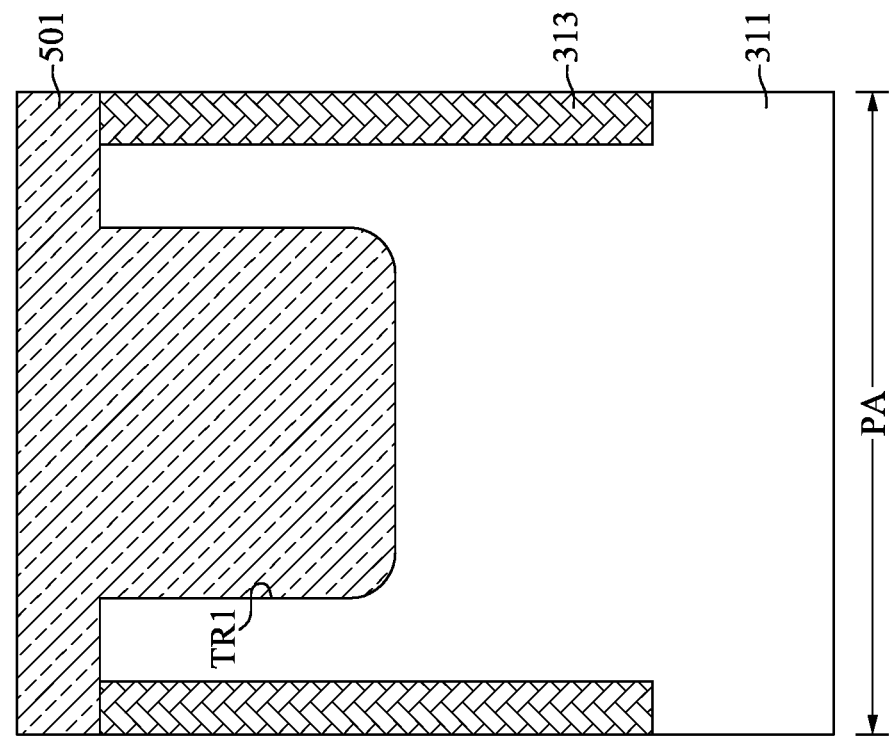
Figure 5:
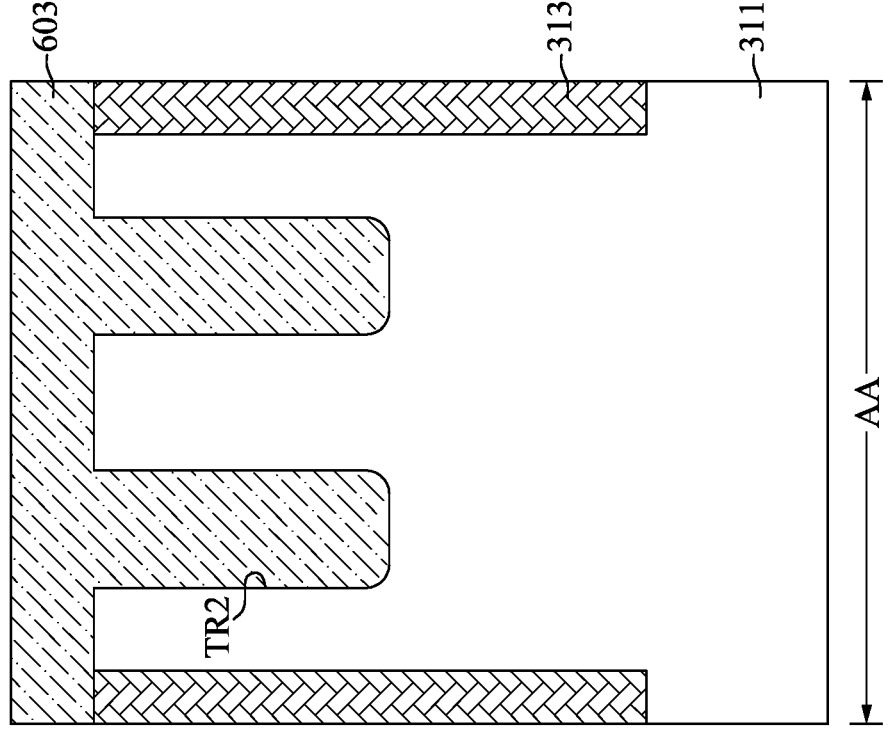

With reference to FIG. 5, the dummy filler layer 501 may be formed to completely fill the peripheral trench TR1 and cover the peripheral area PA of the substrate 311. In some embodiments, the dummy filler layer 501 may be composed of carbon and hydrogen. In some embodiments, the dummy filler layer 501 may be composed of carbon, hydrogen, and oxygen. In some embodiments, the dummy filler layer 501 may be composed of carbon, hydrogen, and fluorine. Alternatively, in some embodiments, the dummy filler layer 501 may be formed of a material identified in the trade as APF (product model, manufactured by AMAT Corp.), a material identified in the trade as SiLK (product model, manufactured by Dow Chemical Co.), a material identified in the trade as NCP (product model, manufactured by ASM Corp.), a material identified in the trade as AHM (product model, manufactured by Novellous Corp.), or similar such materials.

In some embodiments, the dummy filler layer 501 may be formed by a high-density plasma chemical vapor deposition process. The high-density plasma may be generated using inductively coupled radio frequency (RF) power in a range between about 500 watts and about 4000 watts. In some embodiments, the high-density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm or between about 50 sccm and about 150 sccm. The process pressure of the high-density plasma chemical vapor deposition process may be about 5 millitorr and about 20 millitorr. The process temperature of the high-density plasma chemical vapor deposition process may be between about 240° C. and about 340° C.

In some embodiments, the dummy filler layer 501 may be formed with fluorine doping by adding a source of fluorine during the high-density plasma chemical vapor deposition process. The source of fluorine may be, for example, octafluorocyclobutane, tetrafluoromethane, hexafluoroethane, octafluoropropane, trifluoromethane, hexafluorobenzene, or a combination thereof. The flow rate of the source of fluorine may be between slightly greater 0 and about 150 sccm. The flow rate ratio of the source of fluorine to the source of carbon is important for the doping level and the thermal stability of the dummy filler layer 501. For an unbiased process situation, the flow rate ratio of the source of fluorine to the source of carbon may be between about 0.2 and about 2. For a biased process situation, the flow rate ratio of the source of fluorine to the source of carbon may be between about 0.7 and about 1.3.

In some embodiments, an annealing process may be performed after the high-density plasma chemical vapor deposition process to enhance the thermal stability of the dummy filler layer 501. The annealing process may be carried out in vacuum, or in an inert atmosphere composed of gasses such as argon or nitrogen, at a temperature between about 300° C. and about 450° C. for approximately 30 minutes.

The dummy filler layer 501 formed by the high-density plasma chemical vapor deposition process may be thermally stable at elevated temperatures up to approximately 400° C. Thermal stability means that the dummy filler layer 501 will not suffer from weight loss, deformation or chemical reactions when exposed to etch environments at temperatures between about 200° C. and about 400° C. The thermal stability of the dummy filler layer 501 at elevated temperatures, will allow for its use as a mask for etch operations that are performed at temperatures higher than 200° C. Furthermore, the etch resistance property of the dummy filler layer 501 may be tuned by adjusting the doping level of fluorine. The etch resistive property of the dummy filler layer 501 may be decreased with higher doping level of fluorine.

In some embodiments, the dummy filler layer 501 may be formed of, for example, a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

The carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C. or between about 350° C. and about 550° C. In some embodiments, the carbon film may be deposited from the processing gas mixture by maintaining a chamber pressure between about 1 Ton and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer the desired pattern onto the underlying layers.

Figure 6:
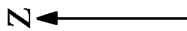
Figure 6:
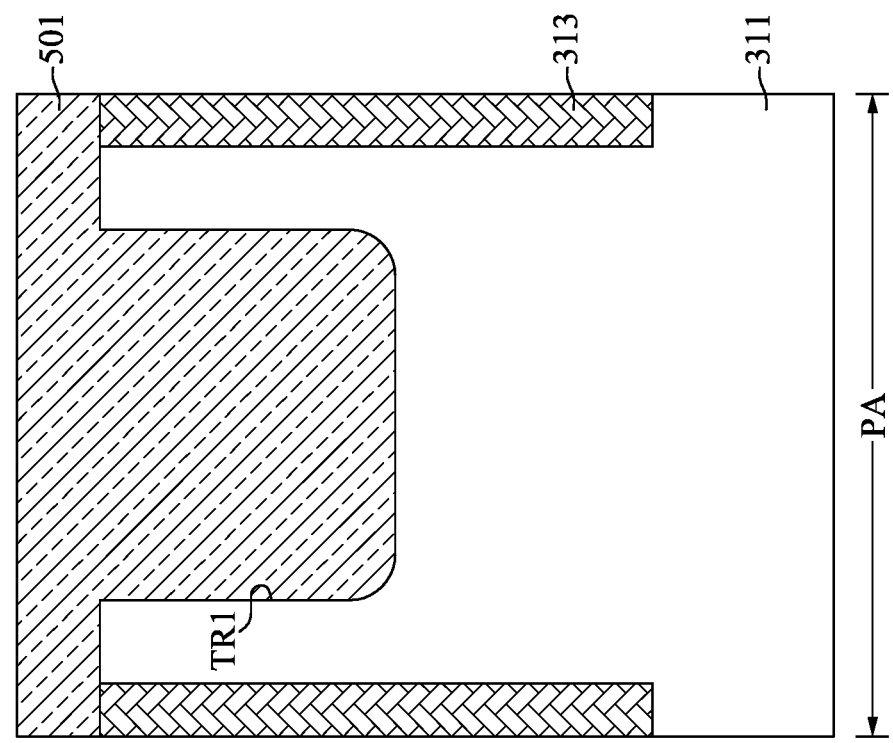
Figure 6:
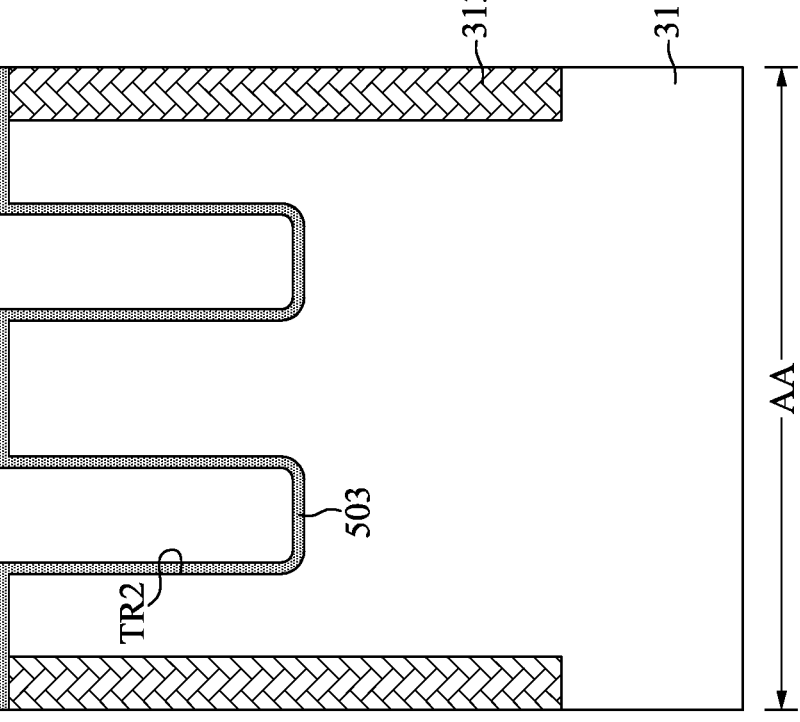

With reference to FIG. 6, the second mask layer 603 may be removed. A layer of first insulating material 503 may be conformally formed on the plurality of array trenches TR2 and covering the top surface of the array area AA of the substrate 311. In some embodiments, the layer of first insulating material 503 may be formed by a thermal oxidation process. For example, the layer of first insulating material 503 may be formed by oxidizing the surface of the plurality of array trenches TR2. In some embodiments, the layer of first insulating material 503 may be formed by a deposition process such as a chemical vapor deposition or an atomic layer deposition. The first insulating material 503 may include a high-k material, an oxide, a nitride, an oxynitride or combinations thereof. In some embodiments, after a liner polysilicon layer is deposited, the layer of first insulating material 503 may be formed by radical-oxidizing the liner polysilicon layer. In some embodiments, after a liner silicon nitride layer is formed, the layer of first insulating material 503 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

Figure 7:
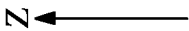
Figure 7:
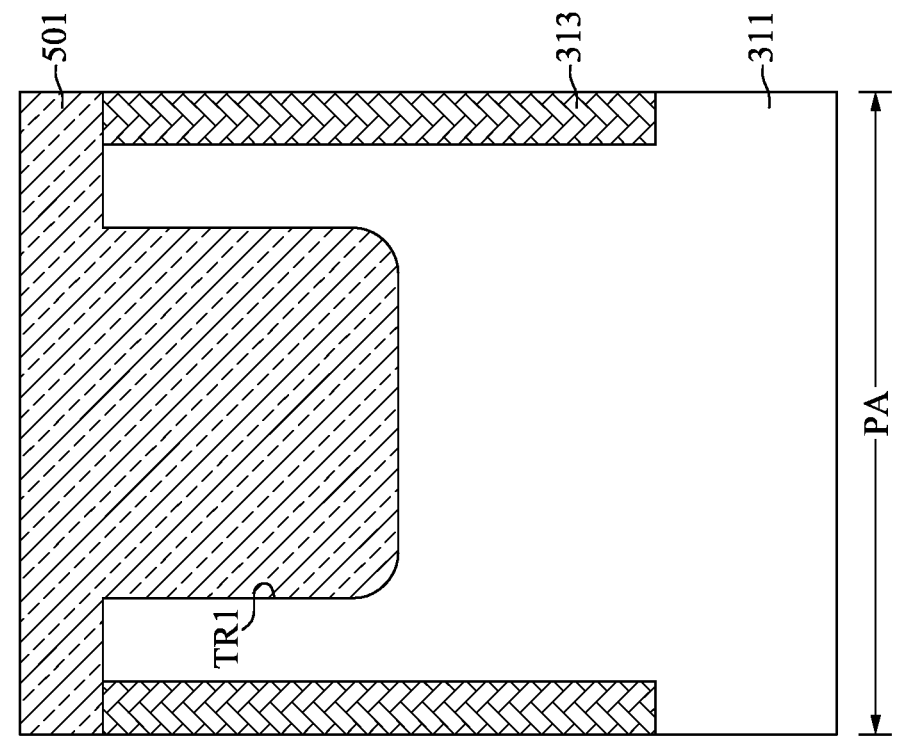
Figure 7:
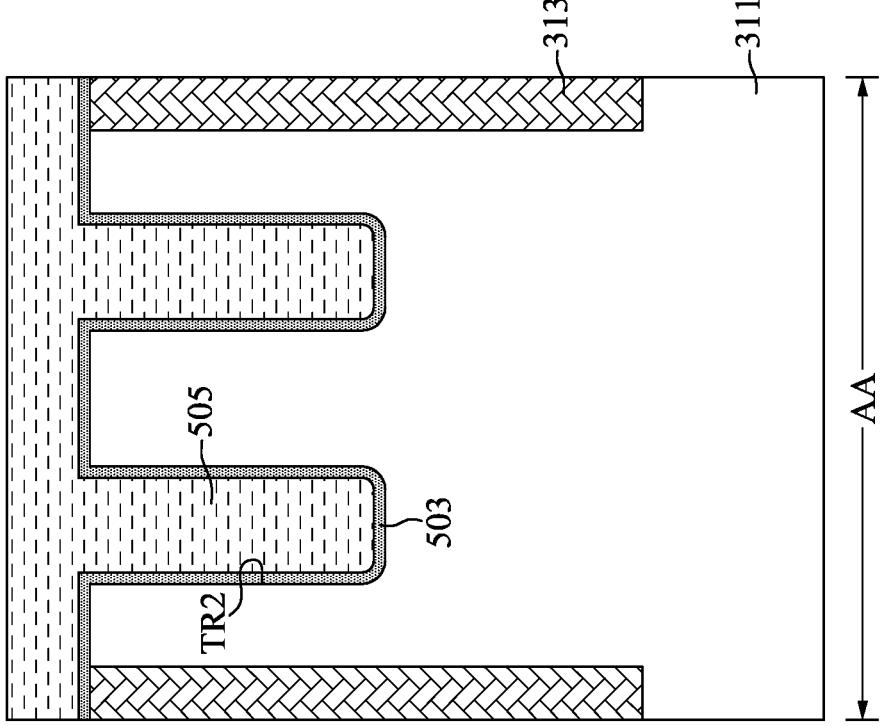
Figure 8:
Figure 9:
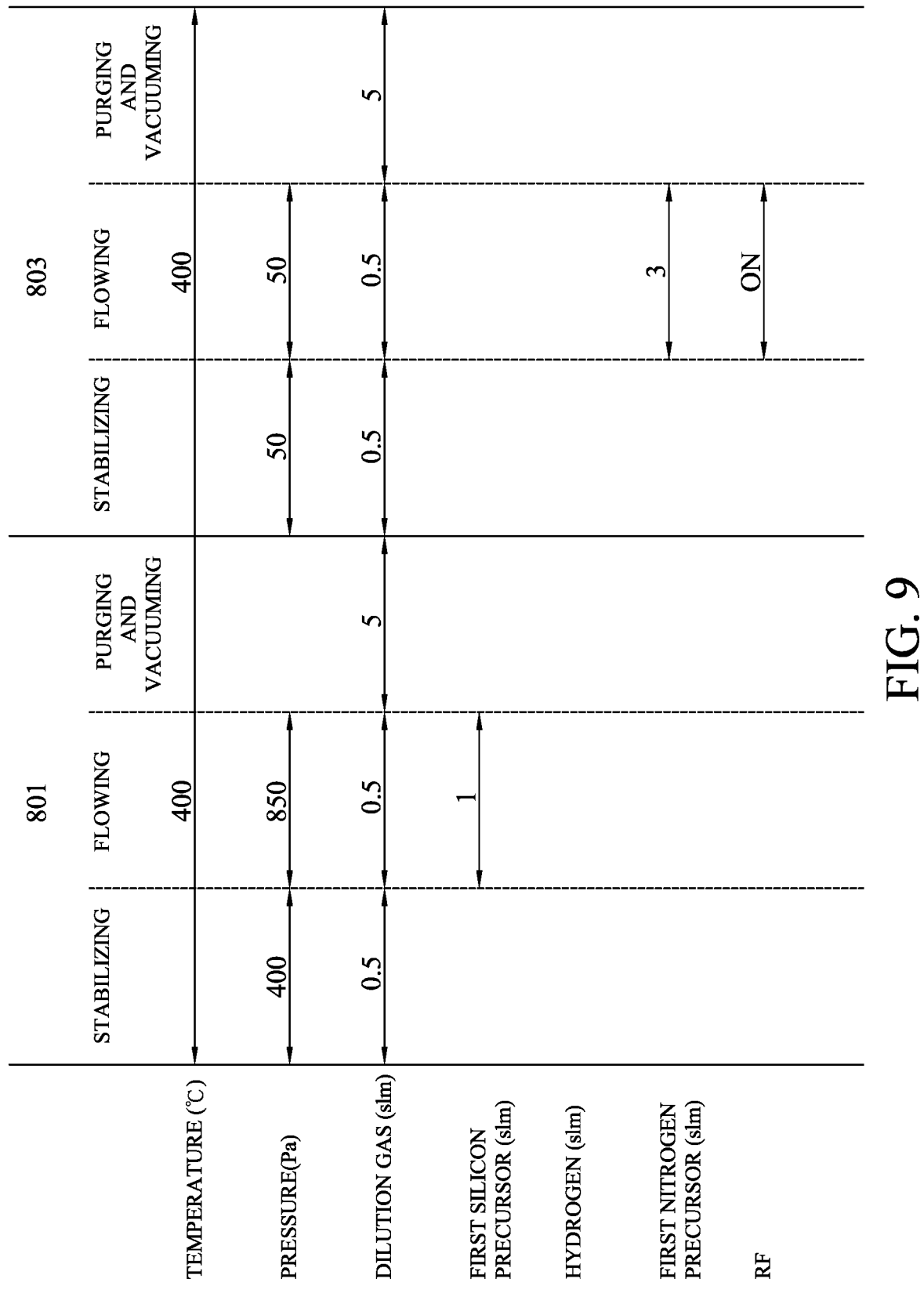
FIG. 9 is a chart showing an example of process conditions for forming a layer of capping material of the semiconductor device in accordance with one embodiment of the present disclosure.

With reference to FIGS. 7 and 8, a layer of first conductive material 505 may be formed on the layer of first insulating material 503 and in the plurality of array trenches TR2. As shown in FIG. 7, the first conductive material 505 may be formed to fill the plurality of array trenches TR2 and cover the array area AA of the substrate 311. As shown in FIG. 8, subsequently, a recessing process may be performed to recess the layer of first conductive material 505 into the plurality of array trenches TR2. After the recessing process, the remaining first conductive material 505 in the plurality of array trenches TR2 may be referred to as array gate conductors 220.

In some embodiments, the recessing process may include multiple stages and may be performed to remove both the first conductive material 505 and the dummy filler layer 501. For example, the recessing process may include a first stage for recessing the layer of first conductive material 505 and a second stage for recessing the dummy filler layer 501. In some embodiments, the recessing process may be performed as an etch-back process or sequentially performed as the planarization process and an etch-back process.

In some embodiments, the recessing process for the dummy filler layer 501 may be an anisotropic plasma etching process. The anisotropic plasma etching process may be performed by plasma etching equipment utilizing an inductively coupled plasma technique or using a dual frequency capacitively coupled plasma technique, or any other suitable plasma technique. In some embodiments, the etchant gases of the anisotropic plasma etching process may be a mixture of an oxygen gas and a silicon-containing gas. The silicon-containing gas may be silicon tetrafluoride, silicon tetrachloride, silane, $SiCl_xF_y$ (wherein x+y=4), or a combination thereof. The etchant gases of the anisotropic plasma etching process may include about 50% to 95% by volume of the oxygen gas and correspondingly about 50% to 5% by volume of the silicon-containing gas respectively based on the total volume of the etchant gases at a given process temperature and process pressure.

Alternatively, in some embodiments, the etching gases of the anisotropic plasma etching process may include the oxygen gas, the silicon-containing gas, and at least one gas selected from a nitrogen gas and an inert gas. Detailedly, the etchant gases of the anisotropic plasma etching process may include about 20% to 95% by volume of the oxygen gas based on the total volume of the etchant gases, about 50% to 5% by volume of the silicon-containing gas based on the total volume of the etchant gases, about 0% to 100% by volume of the nitrogen gas relative to the volume of the oxygen gas in the etchant gases, and about 0% to 50% by volume of the inert gas relative to the volume of oxygen gas in the etchant gases. It should be noted that the content of the nitrogen gas and the content of the inert gas in the etchant gases are not both zero. The presence of the nitrogen gas in the etchant gases provides a lower etch rate than would undiluted oxygen gas with respect to the dummy filler layer 501, but the nitrogen gas serves to increase passivation during the etching of the dummy filler layer 501. This improves anisotropic etching properties.

The presence of inert gas in the etching gases improves anisotropic dry etching properties of the etching gases and also stabilizes the plasma atmosphere. The inert gas may be selected from the group consisting of argon, helium, neon and krypton. For example, the etchant gases of the anisotropic plasma etching process may be a mixture of the oxygen gas, silicon tetrafluoride, the nitrogen gas, and an argon gas. The flow rate of the oxygen gas may be between about 20 sccm and about 60 sccm, for example, 40 sccm. The flow rate of the silicon tetrafluoride may be between about 10 sccm and about 30 sccm, for example, 20 sccm. The flow rate of the nitrogen gas may be between about 10 sccm and about 30 sccm, for example, 20 sccm. The flow rate of the argon gas may be between about 10 sccm and about 30 sccm, for example, 20 sccm. The etchant gas of the anisotropic plasma etching process may include a volume concentration of 40% oxygen gas, 20% silicon tetrafluoride, 20% nitrogen gas, and 20% argon gas. The process duration may be between 70 seconds and about 110 seconds, for example, 90 seconds.

Alternatively, in some embodiments, the etchant gases of the anisotropic plasma etching process may further include a carbon-fluorine-series gas, such as carbon tetrafluoride, hexafluoroethane, perflutren, octafluorocyclobutane, hexafluorocyclobutene, octafluorocyclopentene, or the like. The carbon-fluorine-series gas may be added to the etchant gases to increase an etch rate of the dummy filler layer 501. The etchant gases may include, for example, about 0% to 10% by volume of the carbon-fluorine-series gas based on the total volume of the etchant gases.

With reference to FIG. 8, in some embodiments, the array gate conductor 220 (i.e., the first conductive material 505) may include a metal, a metal nitride, or a combination thereof. For example, the array gate conductor 220 may be formed of titanium nitride, tungsten, or a titanium nitride/tungsten. After the titanium nitride is conformally formed, the titanium nitride/tungsten may have a structure where the plurality of array trenches TR2 are partially filled using tungsten. The titanium nitride or the tungsten may be solely used for the array gate conductor 220. In some embodiments, the array gate conductor 220 may be formed of, for example, a conductive material such as polycrystalline silicon, polycrystalline silicon germanium, or a combination thereof. In some embodiments, the array gate conductor 220 may be doped with a dopant such as phosphorus, arsenic, antimony, or boron. In some embodiments, the array gate conductor 220 may be formed of, for example, tungsten, aluminum, titanium, copper, the like, or a combination thereof.

With reference to FIG. 8, after the recessing process, the top surfaces 220TS of the array gate conductors 220 and the top surface 501TS of the dummy filler layer 501 may be at the same vertical level VL2. In some embodiments, the top surfaces 220TS of the array gate conductors 220 and the top surface 501TS of the dummy filler layer 501 may be at different vertical levels (not shown). For example, the top surfaces 220TS of the array gate conductors 220 may be at a vertical level lower than a vertical level of the top surface 501TS of the dummy filler layer 501. For another example, the top surfaces 220TS of the array gate conductors 220 may be at a vertical level higher than a vertical level of the top surface 501TS of the dummy filler layer 501.

Figure 10:
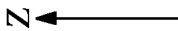
FIGS. 10 to 21 illustrate, in schematic cross-sectional view diagrams, part of the flow for fabricating the semiconductor device in accordance with one embodiment of the present disclosure.
Figure 10:
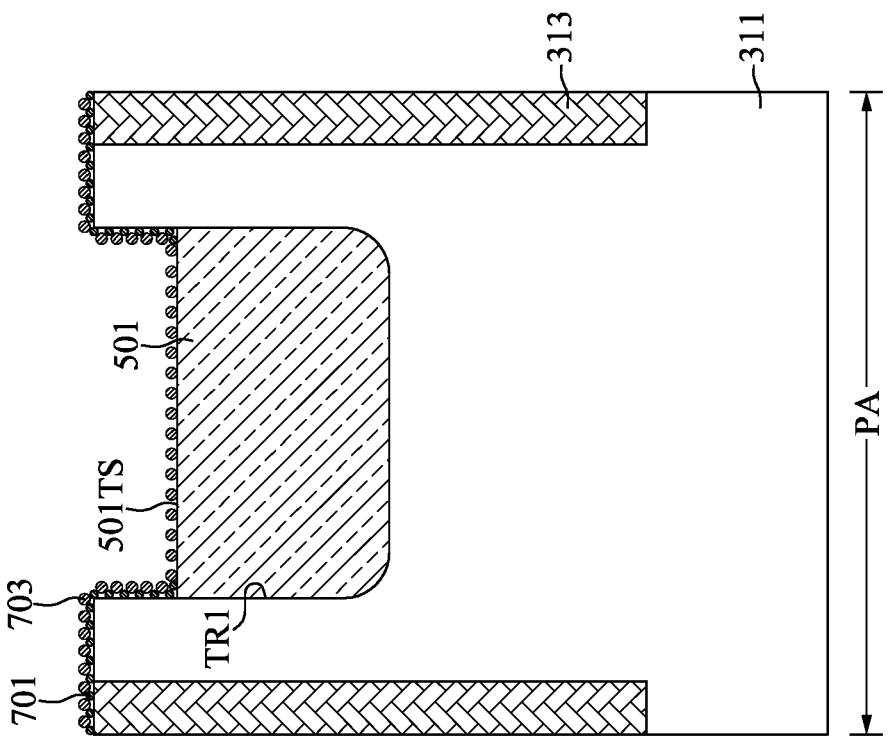
Figure 10:
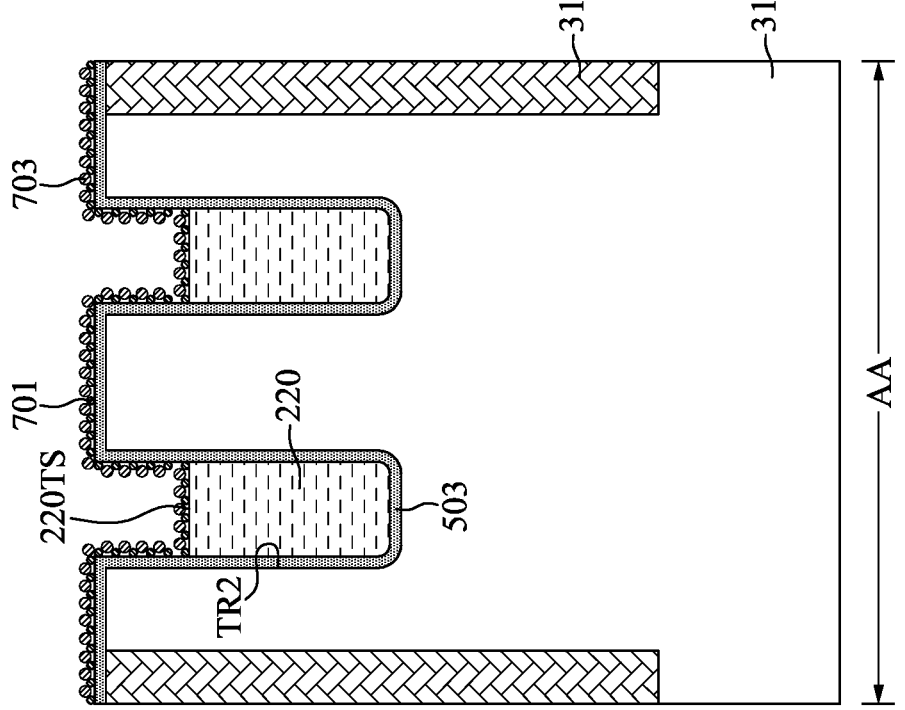
Figure 11:
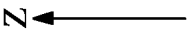
Figure 11:
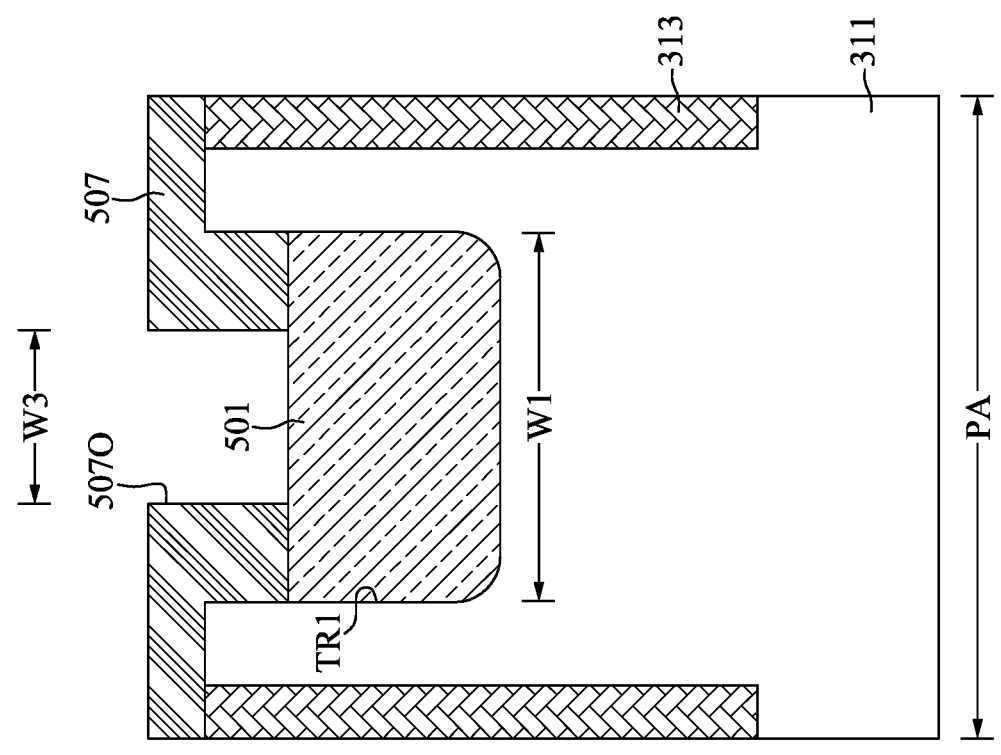

With reference to FIGS. 9 to 11, a layer of capping material 507 may be formed over the array area AA and the peripheral area PA of the substrate 311. The layer of capping material 507 may be formed on the array gate conductors 220 and completely fill the plurality of array trenches TR2. In contrast, the layer of capping material 507 may be formed on the dummy filler layer 501 and partially fill the peripheral trench TR1. Detailedly, the layer of capping material 507 formed over the peripheral area PA may include an opening 507O. The dummy filler layer 501 may be exposed through the opening 507O. In some embodiments, the capping material 507 may be, for example, a material having etching selectivity to the dummy filler layer 501. In some embodiments, the capping material 507 may include, silicon nitride, silicon oxide, silicon nitride oxide, silicon oxynitride, a high-k dielectric, or a combination thereof.

For example, the layer of capping material 507 may be formed of silicon nitride. The layer of capping material 507 may be formed by a first deposition process. The first deposition may be an atomic layer deposition process. Generally, the atomic layer deposition process alternately supplies two (or more) different source gases one by one onto a process object under predetermined process conditions, so that chemical species from the source gases are adsorbed to the process object at a single atomic layer level, and are deposited on the process object through surface reactions. For instance, a first source gas and a second source gas are alternately supplied to a process object to flow along the surface thereof, thereby molecules (or chemical species) contained in the first source gas adsorb to the surface of the process object, and molecules (or chemical species) contained in the second source gas react with the adsorbed molecules originated from the first source gas to form a film of a thickness of a single molecule level. The above process steps are performed repeatedly, so that a high-quality film may be formed on the process object.

In some embodiments, in the atomic layer deposition process of the present embodiment, the supply of the first source gas may be limited so that the first precursor molecules 701 in the first source gas may not completely adsorb on the plurality of array trenches TR2 and the peripheral trench TR1. Detailedly, the first precursor molecules 701 may only adsorb on the layer of first insulating material 503 on the top surface of the substrate 311 and in the plurality of array trenches TR2, adsorb on the top surface of the array gate conductors 220, and adsorb on the sidewall of the peripheral trench TR1. The first precursor molecules 701 may not completely adsorb on the peripheral trench TR1 due to the greater width of the peripheral trench TR1 compared to that of the plurality of array trenches TR2.

As a result, the film (i.e., the layer of capping material 507) formed by the second precursor molecules 703 in the second source gas react with the adsorbed first precursor molecules 701 may be formed to completely fill the plurality of array trenches TR2 and partially fill the peripheral trench TR1 with the opening 507O exposing the dummy filler layer 501.

In some embodiments, the limited supply of first source gas may be achieved by precisely controlling the transferring time of the first source gas. For example, the transferring time of the first source gas may be between about 0.15 seconds and about 0.50 seconds, between 0.15 seconds and about 0.30 seconds, or about 0.2 seconds. In some embodiments, the limited supply of first source gas may be achieved by controlling the flow rate of the first source gas.

In some embodiments, the first deposition process may include a first silicon precursor supplying step 801 and a first nitrogen precursor supplying step 803 performed sequentially. In the first silicon precursor supplying step 801, a first silicon precursor (i.e., the first source gas) may be supplied to the reaction chamber and the chemical species from the first silicon precursor (e.g., the first precursor molecules 701) may be adsorbed to the layer of first insulating material 503 on the top surface of the substrate 311 and in the plurality of array trenches TR2, to the top surface of the array gate conductors 220, and to the sidewall of the peripheral trench TR1 at a single atomic layer level. In the first nitrogen precursor supplying step 803, a first nitrogen precursor (i.e., the second source gas) may be activated and supplied to the reaction chamber and the chemical species contained in the first nitrogen precursor (e.g., the second precursor molecules 703) may react with the adsorbed chemical species originated from the first silicon precursor to form a silicon nitride film of a thickness of a single molecule level. The silicon nitride film may be formed to completely fill the plurality of array trenches TR2 and partially fill the peripheral trench TR1 with the opening 507O exposing the dummy filler layer 501.

The first silicon precursor supplying step 801 may include a stabilizing stage, a flowing stage, and a purging and vacuuming stage.

With reference to FIGS. 9 to 11, in the stabilizing stage of the first silicon precursor supplying step 801, a dilution gas (or a carrier gas) such as nitrogen gas may be supplied to the reaction chamber. A flow rate of the dilution gas may be between about 0.3 slm (standard liter per minute) and about 0.7 slm. For example, in the present embodiment, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the present embodiment, the process temperature of the stabilizing stage may be 400° C. A process pressure of the stabilizing stage may be between about 200 Pa and about 600 Pa, between about 300 Pa and about 500 Pa, or between about 350 Pa and about 450 Pa. For example, in the present embodiment, the process pressure of the stabilizing stage may be 400 Pa.

With reference to FIGS. 9 to 11, in the flowing stage of the first silicon precursor supplying step 801, the first silicon precursor may be supplied to the reaction chamber while the dilution gas is supplying. The chemical species from the first silicon precursor may be adsorbed to the layer of first insulating material 503 on the top surface of the substrate 311 and in the plurality of array trenches TR2, to the top surface of the array gate conductors 220, and to the sidewall of the peripheral trench TR1 at a single atomic layer level. In some embodiments, the first silicon precursor may include a halide, such as iodine (I) or chlorine (Cl). In the present embodiment, the first silicon precursor may be, for example, dichlorosilane. The reaction between the first silicon precursor and the adsorbed surface may be shown in Formula 1. In some embodiments, the first silicon precursor may include, for example, silicon tetrachloride, trichlorosilane, dichlorosilane, or hexachlorodisilane. In some embodiments, the first silicon precursor may include, for example, silicon tetraiodide, triiododsilane, diiodosilane, iodosilane, disilicon hexaiodide, trisilicon octaiodide, $H_2Si_2I_4$, $H_3Si_2I_3$, $H_4Si_2I_2$, $H_5Si_2I$, or $HSi_2I_5$. In some embodiments, the first silicon precursor may include one of triiododsilane, diiodosilane, iodosilane, $H_2Si_2I_4$, $H_4Si_2I_2$, and $H_5Si_2I$. In some embodiments, the first silicon precursor may include two, three, four, five or six of triiododsilane, diiodosilane, iodosilane, $H_2Si_2I_4$, $H_4Si_2I_2$, and $H_5Si_2I$, including any combinations thereof.

$$-NH_2+SiH_2Cl_2 \rightarrow -NH-SiH_2Cl+HCl\Uparrow \qquad \text{(Formula 1)}$$

With reference to FIGS. 9 to 11, in the flowing stage of the first silicon precursor supplying step 801, a flow rate of the first silicon precursor may be between about 1 slm and about 5 slm or between about 3 slm and about 4.5 slm. For example, in the present embodiment, the flow rate of the first silicon precursor may be 1 slm. If the flow rate of the first silicon precursor is lower than 1 slm, the amount of the first silicon precursor may be not sufficient to supply to the nitrogen atoms on the adsorbed surface. If the flow rate of the first silicon precursor is greater than 5 slm, the chemical species contained in the first silicon precursor may adsorb on the dummy filler layer 501 so that the formed silicon nitride film may completely cover the peripheral trench TR1. As a result, the dummy filler layer 501 may be completely covered by the layer of capping material 507. In some embodiments, a flow rate of the dilution gas may be between about 0.3 slm and about 0.7 slm. For example, in the present embodiment, the flow rate of the dilution gas may be 0.5 slm.

With reference to FIGS. 9 to 11, in the flowing stage of the first silicon precursor supplying step 801, a process temperature of the flowing stage may be between about 200° C. and about 550° C. For example, in the present embodiment, the process temperature of the flowing stage may be about 400° C. If the process temperature is lower than 200° C., the chemical species from the first silicon precursor may not adsorb to the adsorbed surface. If the process temperature is greater than 550° C., the reliability of semiconductor device 1A may be affected. In some embodiments, the process temperature of the flowing stage may be between about 390° C. and about 410° C. By using the aforementioned temperature range, the deposition rate may be increased, and various characteristics, such as thickness uniformity, wet etch resistance property and film stress, of the resultant silicon nitride layer may be improved.

With reference to FIGS. 9 to 11, in the flowing stage of the first silicon precursor supplying step 801, a process pressure of the flowing stage may be between about 400 Pa and about 1200 Pa, between about 600 Pa and about 1100 Pa, or between about 800 Pa and about 1000 Pa. For example, in the present embodiment, the process pressure of the flowing stage may be 850 Pa. By using the aforementioned pressure range, the reaction rate between nitrogen atoms and the first silicon precursor may be increased and the pressure may be readily regulated.

With reference to FIGS. 9 to 11, in the purging and vacuuming stage of the first silicon precursor supplying step 801, the supply of the first silicon precursor may be stopped. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

In some embodiments, the first nitrogen precursor supplying step 803 may include a stabilizing stage, a flowing stage, and a purging and vacuuming stage.

With reference to FIGS. 9 to 11, in the stabilizing stage of the first nitrogen precursor supplying step 803, a dilution gas such as nitrogen gas may be supplied to the reaction chamber. A flow rate of the dilution gas may be between about 0.3 slm and about 0.7 slm. For example, in the present embodiment, the flow rate of the dilution gas may be 0.5 slm. A process temperature of the stabilizing stage may be between about 25° C. and about 700° C., between about 50° C. and about 600° C., between about 100° C. and about 500° C., between about 200° C. and about 450° C., or between about 350° C. and about 425° C. For example, in the present embodiment, the process temperature of the stabilizing stage may be 400° C. A process pressure of the stabilizing stage may be between about 10 Pa and about 70 Pa, between about 20 Pa and about 60 Pa, or between about 30 Pa and about 50 Pa. For example, in the present embodiment, the process pressure of the stabilizing stage may be 50 Pa.

With reference to FIGS. 9 to 11, in the flowing stage of the first nitrogen precursor supplying step 803, the first nitrogen precursor may be activated in a plasma generating unit and then supplied to the reaction chamber while the dilution gas is supplying. The chemical species contained in the activated first nitrogen precursor may react with the adsorbed chemical species originated from the first silicon precursor to form the silicon nitride film on the adsorbed surface. The first nitrogen precursor may be, for example, ammonia gas.

With reference to FIGS. 9 to 11, in the flowing stage of the first nitrogen precursor supplying step 803, a radio frequency (RF) in the plasma generating unit may be turned on to activate the first nitrogen precursor. A radio frequency power of the flowing stage may be between about 50 W and about 1000 W or between about 100 W and about 300 W. If the radio frequency power of the flowing stage is greater than 1000 W, the quartz walls of the plasma generating unit may be damaged. A radio frequency power density of the flowing stage may be between about 0.02 W/cm² and about 2.0 W/cm² or between about 0.05 W/cm² and about 1.5 W/cm². The process frequency of the plasma generating unit may be between about 10.00 MHz and about 15.00 MHz. For example, in the present embodiment, the process frequency of the plasma generating unit in the flowing stage may be 13.56 MHz. In the embodiment depicted, the activated first nitrogen precursors may be ammonia radicals (NH₃*). The activated first nitrogen precursor may be supplied to the reaction chamber in the form of plasma.

With reference to FIGS. 9 to 11, in the flowing stage of the first nitrogen precursor supplying step 803, a flow rate of the activated first nitrogen precursor may be between about 0.5 slm and about 5 slm or between 3 slm and about 5 slm. By using the aforementioned flow rate range, the plasma of activated first nitrogen precursor may be readily generated and the amount of the activated first nitrogen precursor may be sufficient to react with the adsorbed chemical species originated from the first silicon precursor. In the present embodiment, the flow rate of the activated first nitrogen precursor may be, for example, 3 slm. It should be noted that the dilution gas may be still supplied in the flowing stage and a flow rate of the dilution gas may be between about 0.3 slm and about 0.7 slm. For example, in the embodiment depicted, the flow rate of the dilution gas may be still 0.5 slm.

With reference to FIGS. 9 to 11, in the flowing stage of the first nitrogen precursor supplying step 803, a process pressure in the reaction chamber may be between about 40 Pa and about 100 Pa or between about 50 Pa and about 70 Pa. For example, in the present embodiment, the process pressure in the reaction chamber may be 50 Pa. A process pressure in the plasma generating unit may be between about 70 Pa and about 600 Pa or between about 280 Pa and about 330 Pa. By using the aforementioned process pressure range in the plasma generating unit, the plasma of activated first nitrogen precursor may be readily generated and the amount of the activated first nitrogen precursor may be sufficient to react with the adsorbed chemical species originated from the first silicon precursor.

With reference to FIGS. 9 to 11, in the flowing stage of the first nitrogen precursor supplying step 803, reactions between the activated first nitrogen precursor and the adsorbed chemical species originated from the first silicon precursor may be shown in Formula 2 and Formula 3.

$$—NH—SiH_2Cl+NH_3^* \rightarrow —NH—SiH_2(NH_2)+HCl \Uparrow \quad \text{(Formula 2)}$$

$$—NH—SiH_2Cl+NH_3^* \rightarrow —NH—SiHCl(NH_2)+H_2 \Uparrow \quad \text{(Formula 3)}$$

In some embodiments, the transferring time of the first nitrogen precursor may be between about 0.40 seconds and about 0.70 seconds, between 0.45 seconds and about 0.65 seconds, or about 0.6 seconds.

With reference to FIGS. 9 to 11, in the purging and vacuuming stage of the first nitrogen precursor supplying step 803, the supply of the first nitrogen precursor may be stopped and the radio frequency of the plasma generating unit may be turned off. A flow rate of the dilution gas may be increased to purge the reaction chamber. For example, the flow rate of the dilution gas may be between about 3 slm and about 7 slm. In the embodiment depicted, the flow rate of the dilution gas may be 5 slm.

After the first deposition process, one layer of the silicon nitride film may be formed. The first deposition process may be repeated for plural times to form layers of the silicon nitride film of desired thickness. The layers of the silicon nitride film of desired thickness may be referred to as the layer of capping material 507. In some embodiments, the repeat times of the first deposition process may be between about 20 and about 60, between about 30 and about 50, or between about 34 and 40.

The layer of capping material 507 may be formed to completely fill the plurality of array trenches TR2 and partially fill the peripheral trench TR1 with the opening 507O exposing the dummy filler layer 501.

With reference to FIG. 11, in some embodiments, the width W3 of the opening 507O and the width W2 of the plurality of array trenches TR2 may be substantially the same. In some embodiments, the width W3 of the opening 507O and the width W2 of the plurality of array trenches TR2 may be different. For example, the width W3 of the opening 507O may be greater than the width W2 of the plurality of array trenches TR2.

Figure 12:
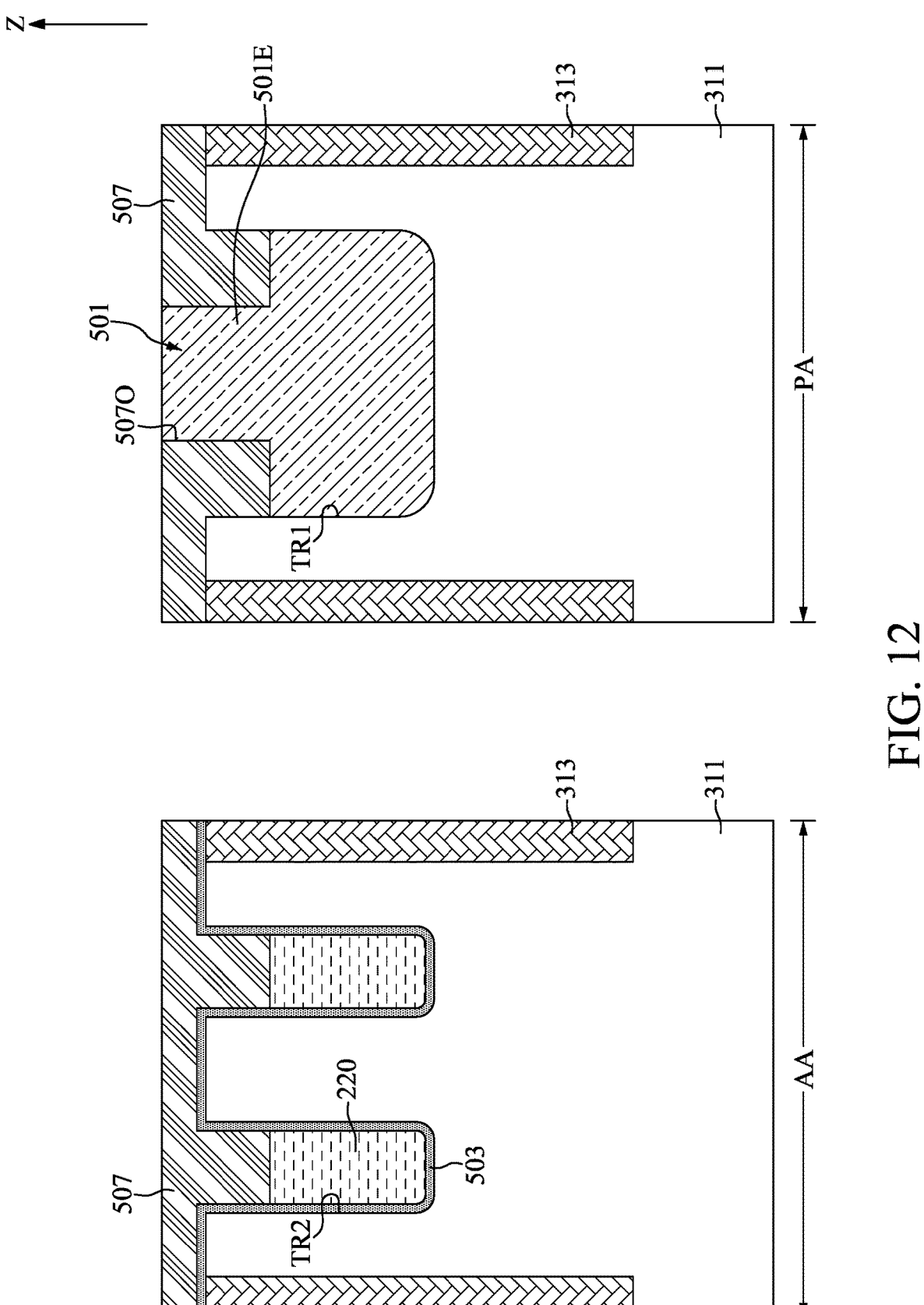

With reference to FIG. 12, the opening 507O may be completely filled by the dummy filler layer 501 with a procedure similar to that illustrated in FIG. 5, and descriptions thereof are not repeated herein. A planarization process, such as chemical mechanical polishing, may be performed until the top surface of the layer of capping material 507 is exposed to remove excess material and provide a substantially flat surface for subsequent processing steps. The portion of the dummy filler layer 501 filled in the opening 507O may be referred to as an extending portion 501E of the dummy filler layer 501. Alternatively, in some embodiments, the opening 507O may not be filled. Alternatively, in some embodiments, the opening 507O may be filled with a material having etching selectivity to the capping material 507.

Figure 13:
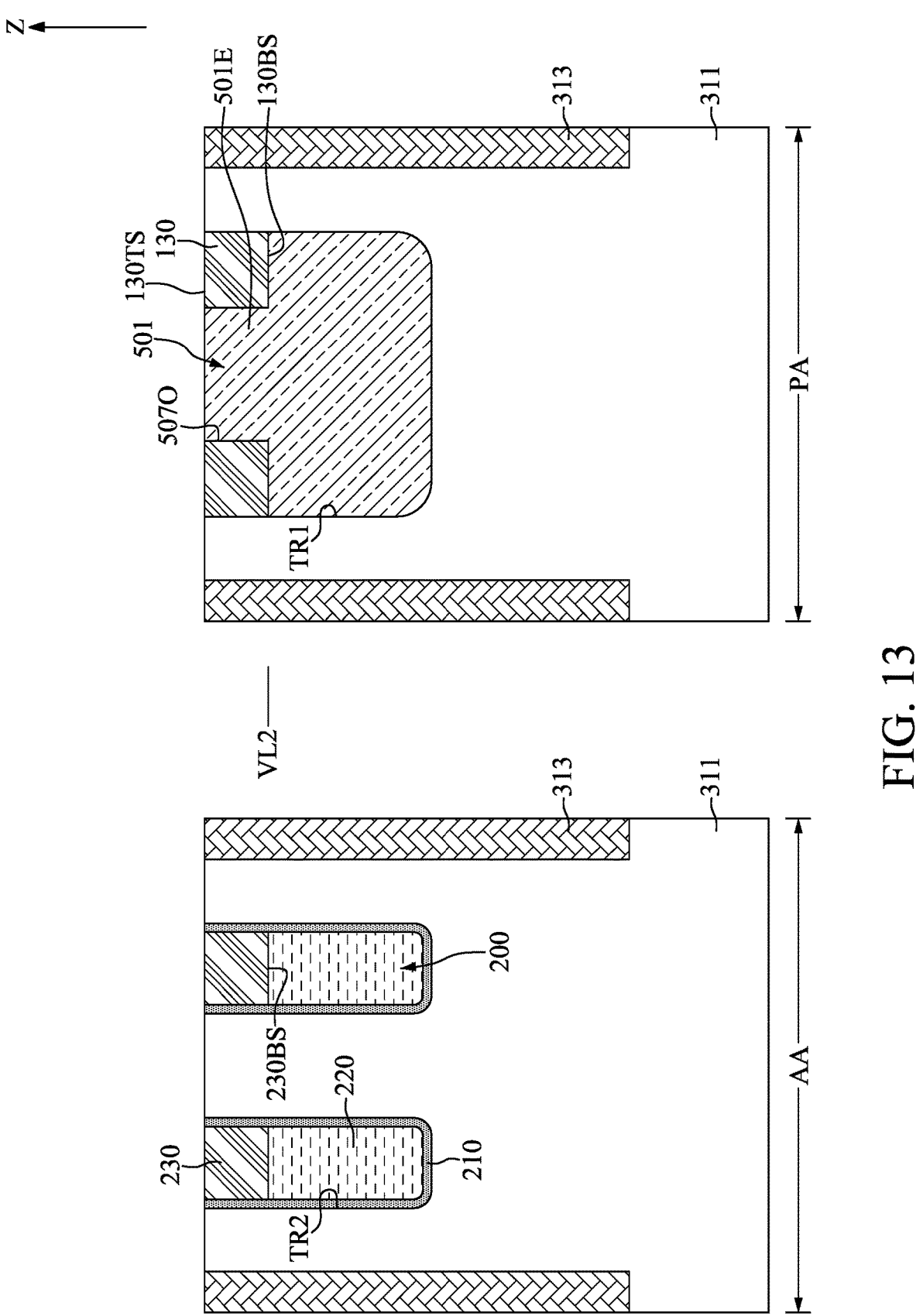

With reference to FIG. 13, a planarization process, such as chemical mechanical polishing, may be performed until the top surface of the substrate 311 is exposed to remove excess material and provide a substantially flat surface for subsequent processing steps. After the planarization process, the remaining capping material 507 at the array area AA may be referred to as the array gate capping layer 230. The remaining first insulating material 503 at the array area AA may be referred to as the array gate dielectric layers 210. The array gate dielectric layer 210 may include a U-shaped cross-sectional profile. The array gate dielectric layer 210, the array gate conductor 220, and the array gate capping layer 230 together configure the array gate structure 200.

With reference to FIG. 13, the remaining capping material 507 at the peripheral area PA may be referred to as a peripheral gate capping layer 130. The peripheral gate capping layer 130 is disposed on the dummy filler layer 501, surrounding the extending portion 501E, and in the peripheral trench TR1. State differently, the peripheral gate capping layer 130 may include (or inherit) the opening 507O and the extending portion 501E of the dummy filler layer 501 is disposed in the opening 507O. The top surface 130TS of the peripheral gate capping layer 130 and the top surface of the substrate 311 may be substantially coplanar.

With reference to FIG. 13, in some embodiments, the bottom surface 130BS of the peripheral gate capping layer 130 and the bottom surface 230BS of the array gate capping layer 230 may be substantially coplanar at the vertical level VL2.

With reference to FIG. 1 and FIGS. 14 to 20, at step S15, the dummy filler layer 501 may be removed and a peripheral gate structure 100 may be formed in the peripheral trench TR1.

Figure 14:
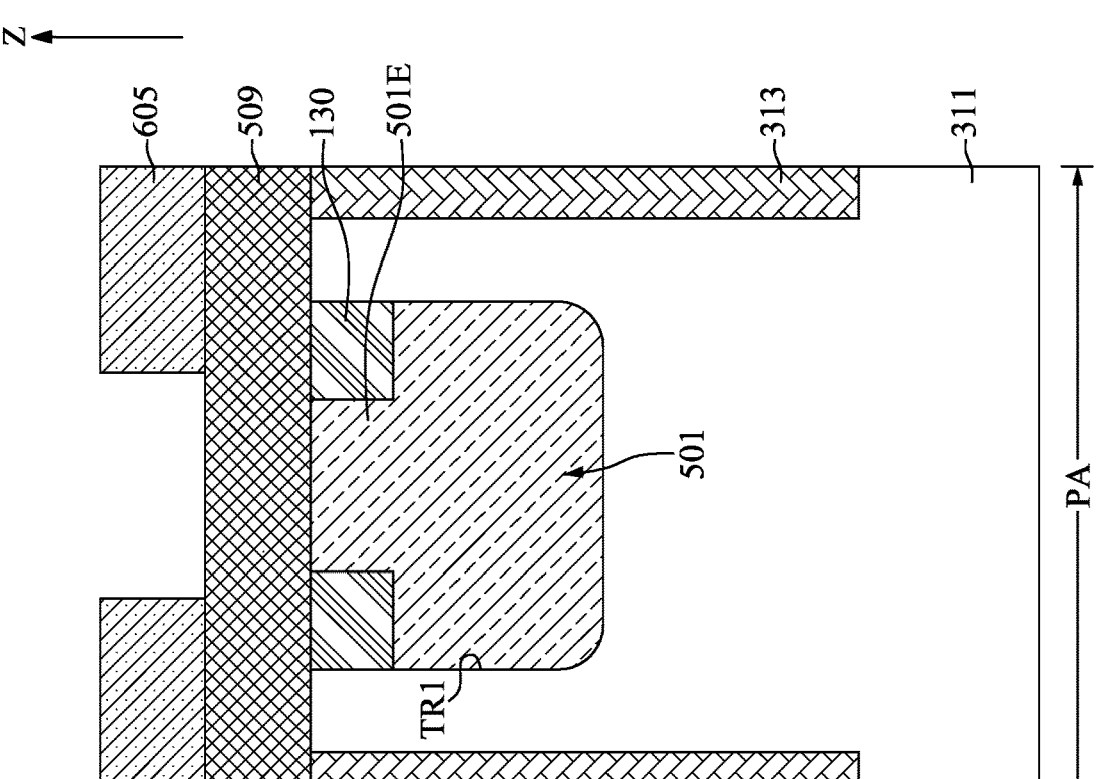
Figure 14:
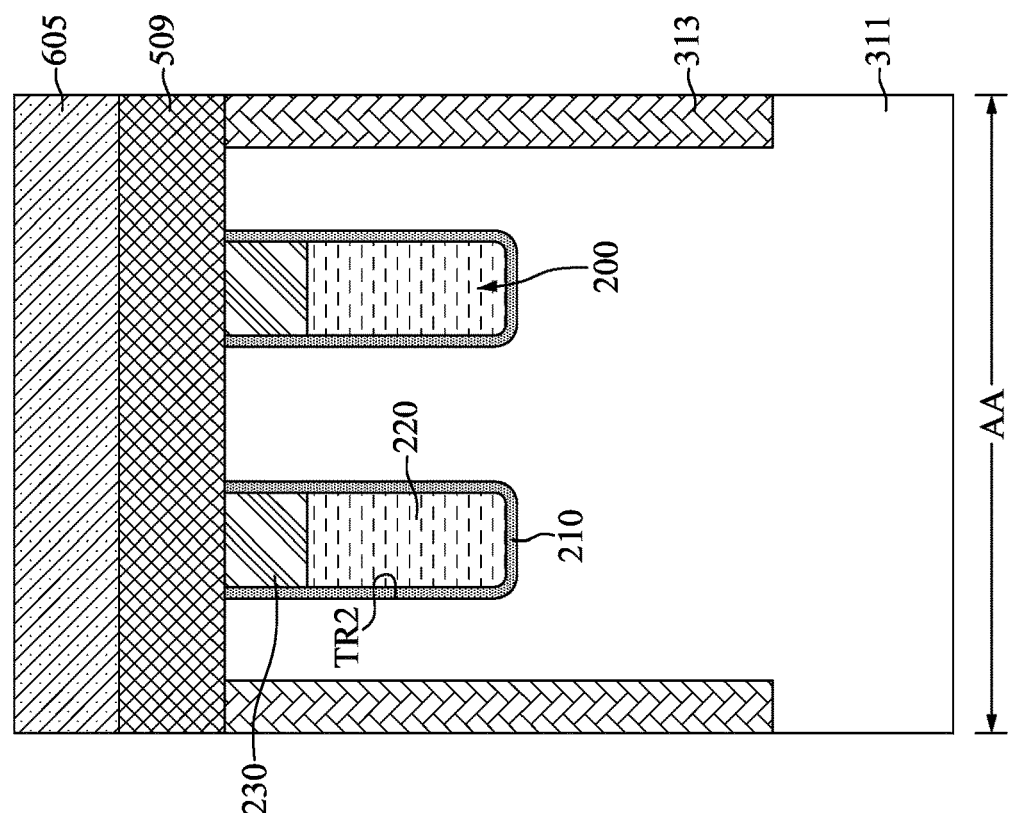

With reference to FIG. 14, a sacrificial layer 509 may be formed on the array area AA and the peripheral area PA of the substrate 311. The plurality of array gate structures 200, the peripheral gate capping layer 130, and the dummy filler layer 501 may be covered by the sacrificial layer 509. In some embodiments, the sacrificial layer 509 may be formed of a material having etching selectivity to the dummy filler layer 501. In some embodiments, the sacrificial layer 509 may be formed of, for example, silicon oxide, silicon nitride, silicon oxynitride, silicon nitride oxide, or a combination thereof. In some embodiments, the sacrificial layer 509 may be formed by, for example, chemical vapor deposition or other applicable deposition processes.

With reference to FIG. 14, a third mask layer 605 may be formed on the sacrificial layer 509. In some embodiments, the third mask layer 605 may be a photoresist layer and may include the pattern of an opening 509O which will be illustrated later.

Figure 15:
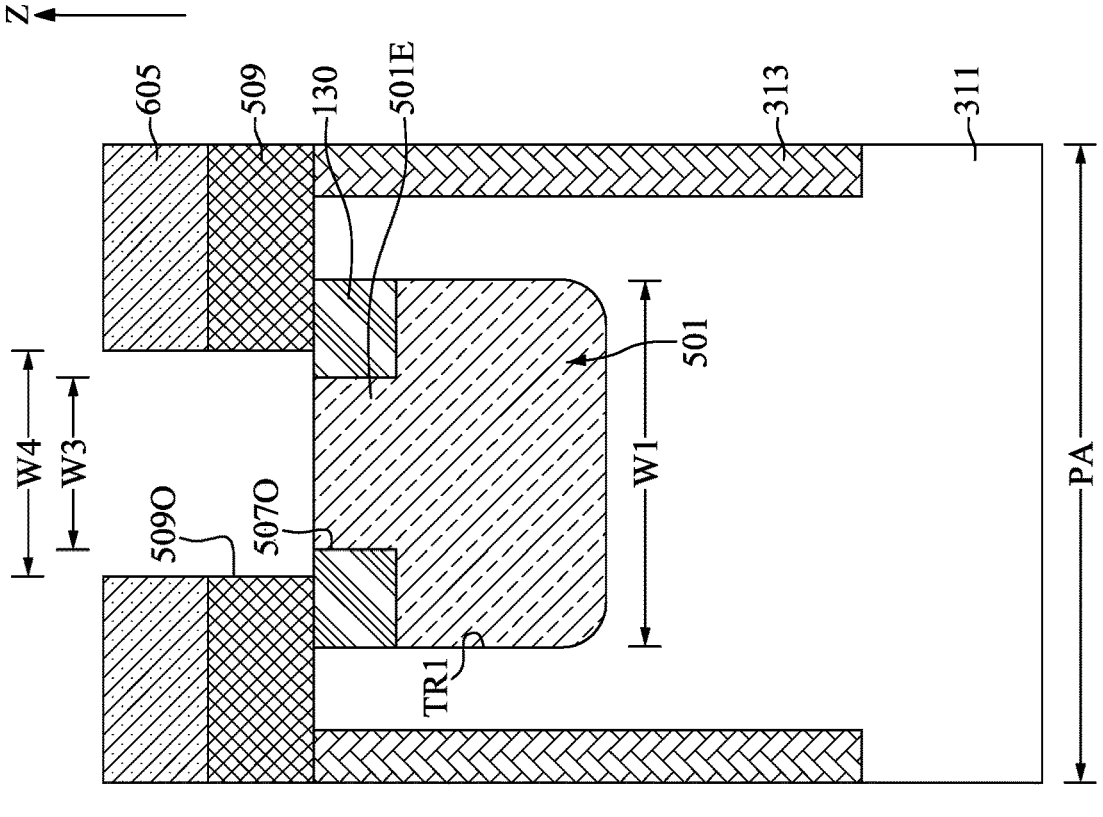
Figure 15:
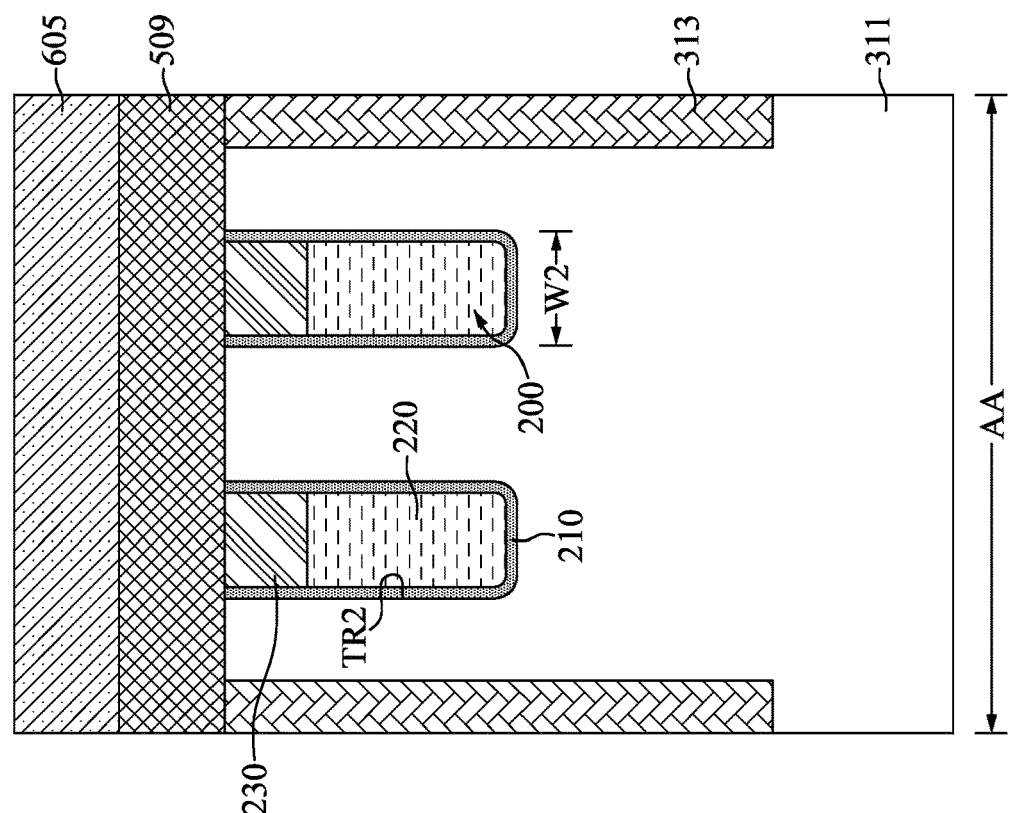

With reference to FIG. 15, an etch process may be performed using the third mask layer 605 as the mask to remove a portion of the sacrificial layer 509 and form the opening 509O along the opening 509O. In some embodiments, the etch rate ratio of the sacrificial layer 509 to the third mask layer 605 may be between about 100:1 and about 1.05:1, between about 15:1 and about 2:1, or between about 10:1 and about 2:1 during the etch process. In some embodiments, the etch rate ratio of the sacrificial layer 509 to the dummy filler layer 501 may be between about 100:1 and about 1.05:1, between about 15:1 and about 2:1, or between about 10:1 and about 2:1 during the etch process. In some embodiments, the etch rate ratio of the sacrificial layer 509 to the peripheral gate capping layer 130 may be between about 100:1 and about 1.05:1, between about 15:1 and about 2:1, or between about 10:1 and about 2:1 during the etch process. After the etch process, the extending portion 501E of the dummy filler layer 501 may be exposed through the opening 509O. The third mask layer 605 may be removed after the opening 509O is formed. In some embodiments, the width W4 of the opening 509O may be greater than the width W3 of the opening 507O and may be less than the width W1 of the peripheral trench TR1.

Figure 16:
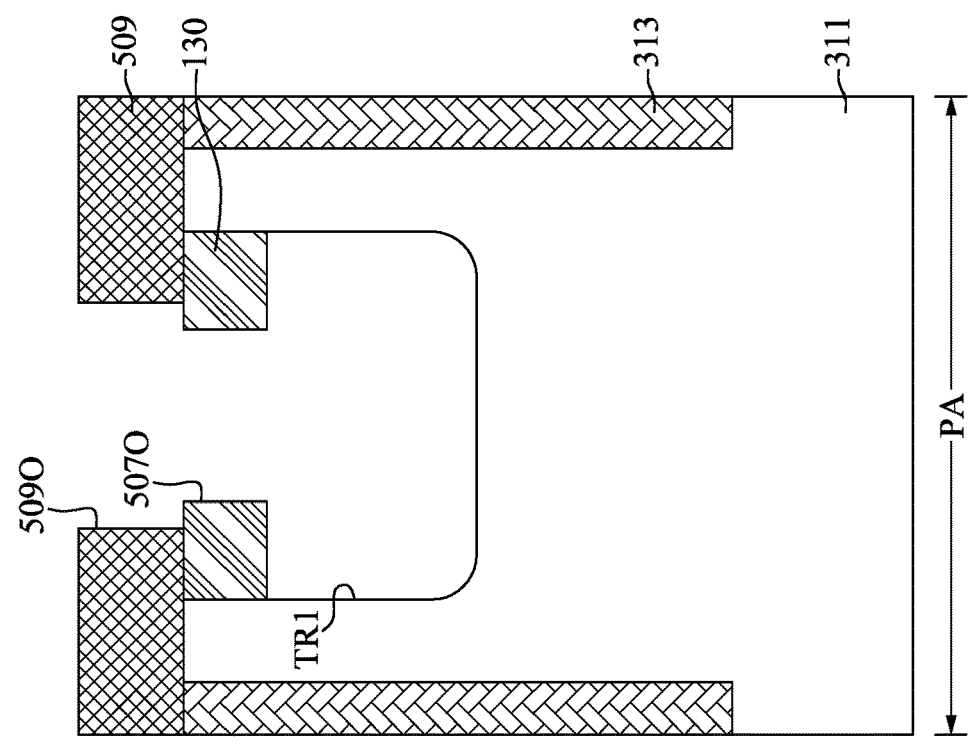
Figure 16:
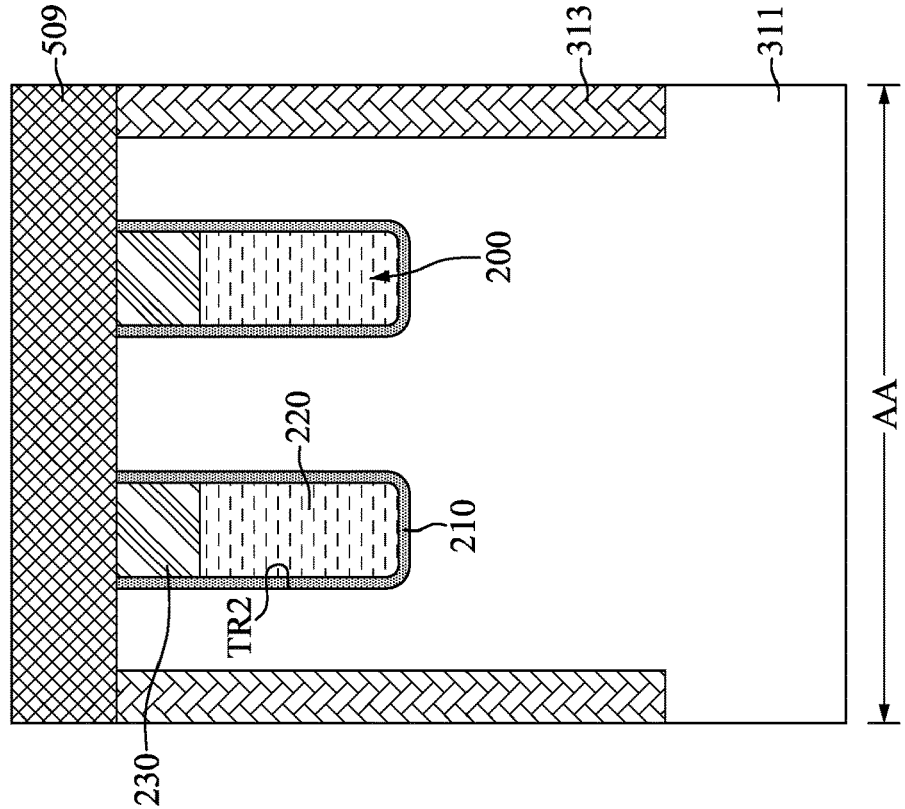

With reference to FIG. 16, the dummy filler layer 501 may be removed. In some embodiments, a process similar to the recessing process for the dummy filler layer 501 illustrated in FIG. 8 may be performed to remove the dummy filler layer 501, and descriptions thereof are not repeated herein. In some embodiments, an etch process, such as an isotropic wet etch process, may be performed using the sacrificial layer 509 including the opening 509O as the mask to remove the dummy filler layer 501. In some embodiments, the etch rate ratio of the dummy filler layer 501 to the sacrificial layer 509 may be between about 100:1 and about 1.05:1, between about 15:1 and about 2:1, or between about 10:1 and about 2:1 during the etch process. In some embodiments, the etch rate ratio of the dummy filler layer 501 to the peripheral gate capping layer 130 may be between about 100:1 and about 1.05:1, between about 15:1 and about 2:1, or between about 10:1 and about 2:1 during the etch process.

Figure 17:
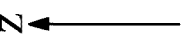

With reference to FIG. 17, a peripheral gate dielectric layer 110 may be formed in the peripheral trench TR1 and below the peripheral gate capping layer 130. The top surface 110TS may contact the peripheral gate capping layer 130 at the vertical level VL2. In some embodiments, the peripheral gate dielectric layer 110 may be formed of, for example, a material different from the array gate dielectric layer 210. In some embodiments, the peripheral gate dielectric layer 110 may be formed of, for example, silicon oxide. The peripheral gate dielectric layer 110 may be formed by, for example, a thermal oxidation process.

Figure 18:
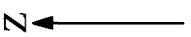
Figure 18:
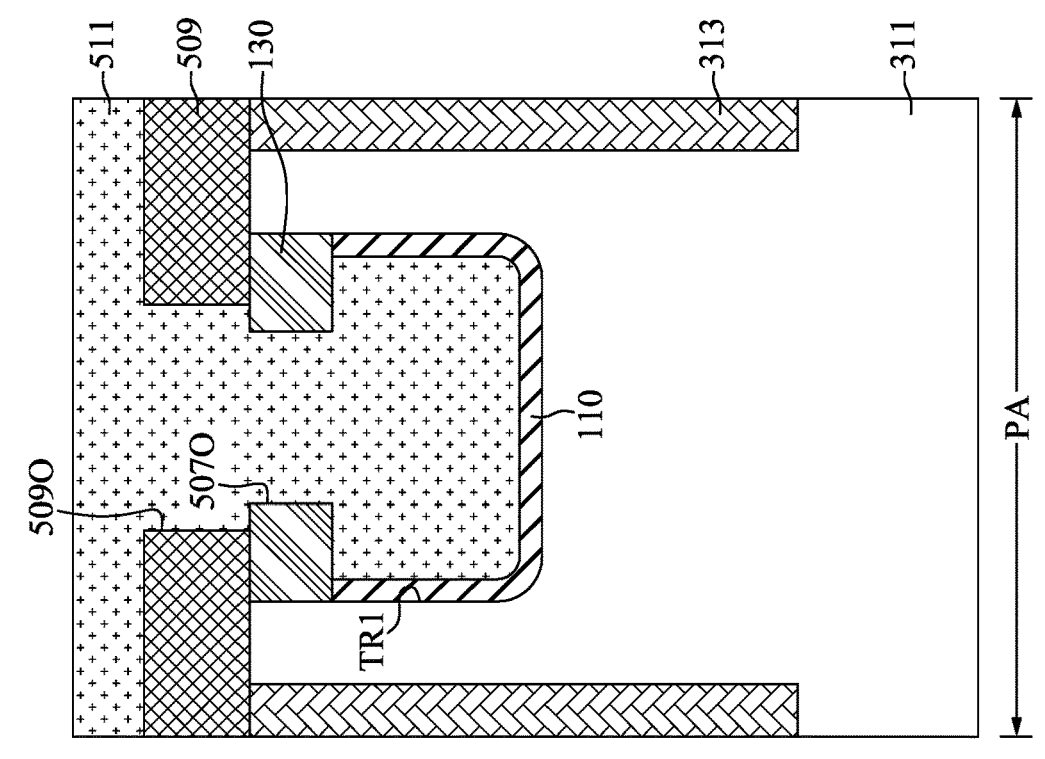

With reference to FIG. 18, a layer of conductor material 511 may be formed to completely fill the peripheral trench TR1 and the opening 507O and cover the array area AA and the peripheral area PA of the substrate 311. In some embodiments, the conductor material 511 may be a material different from the array gate conductor 220. In some embodiments, the conductor material 511 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the layer of conductor material 511 may be formed of, for example, chemical vapor deposition, physical vapor deposition, atomic layer deposition, electroplating, sputtering, or other applicable deposition processes.

Figure 19:
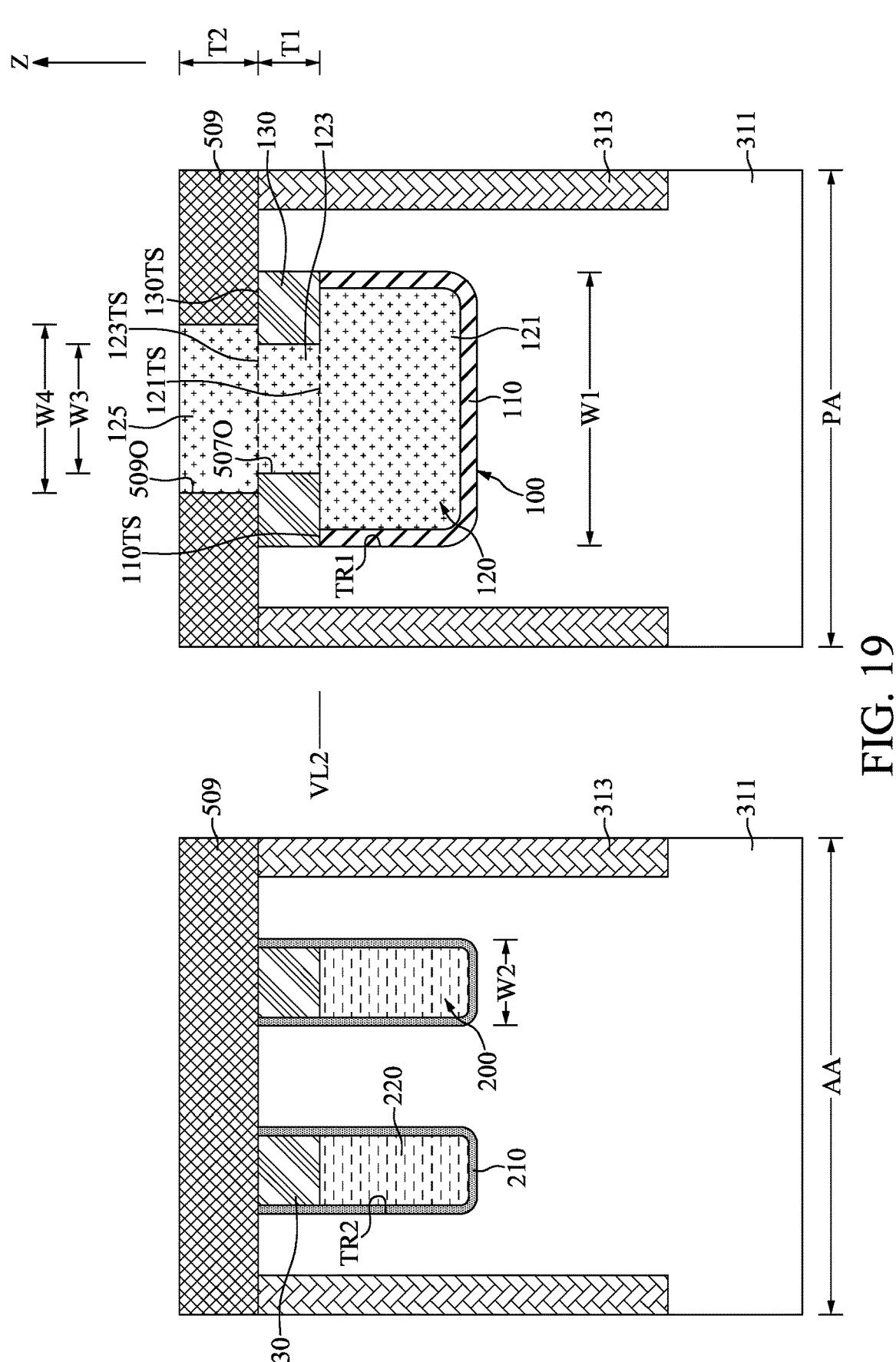

With reference to FIG. 19, a planarization process, such as chemical mechanical polishing, may be performed until the top surface of the sacrificial layer 509 is exposed to remove excess material and provide a substantially flat surface for subsequent processing steps. After the planarization process, the remaining conductor material 511 may be turned into a peripheral gate conductor 120. The peripheral gate dielectric layer 110, the peripheral gate conductor 120, and the peripheral gate capping layer 130 together configure the peripheral gate structure 100. The peripheral gate conductor 120 may include a bottom portion 121, a neck portion 123, and a top portion 125.

With reference to FIG. 19, the bottom portion 121 may be disposed in the peripheral trench TR1 and on the peripheral gate dielectric layer 110. A portion of the top surface 121TS of the bottom portion 121 may contact the peripheral gate capping layer 130. The top surface 121TS of the bottom portion 121 and the top surface 110TS of the peripheral gate dielectric layer 110 may be substantially coplanar at the vertical level VL2. The neck portion 123 may be disposed on the bottom portion 121 and in the peripheral trench TR1. The peripheral gate capping layer 130 may surround the neck portion 123. State differently, the neck portion 123 may be disposed in the opening 507O of the peripheral gate capping layer 130 and disposed on the bottom portion 121. The top surface 123TS of the neck portion 123 and the top surface 130TS of the peripheral gate capping layer 130 may be substantially coplanar. The top portion 125 may be disposed on the neck portion 123. The sacrificial layer 509 may surround the top portion 125. State differently, the top portion 125 may be disposed in the opening 509O and disposed on the neck portion 123.

With reference to FIG. 19, the width W1 of the peripheral gate structure 100 may be greater than the width W2 of the array gate structure 200. In some embodiments, the width ratio of the width W1 of the peripheral gate structure 100 to the width W2 of the array gate structure 200 may be between about 8 and about 2 or between about 6 and about 2.5. In some embodiments, the width W3 of the neck portion 123 may be less than the width W4 of the top portion 125. In some embodiments, the thickness T1 of the neck portion 123 and the thickness T2 of the top portion 125 may be substantially the same. In some embodiments, the thickness T1 of the neck portion 123 and the thickness T2 of the top portion 125 may be different. For example, the thickness T1 of the neck portion 123 may be greater than the thickness T2 of the top portion 125. For another example, the thickness T1 of the neck portion 123 may be less than the thickness T2 of the top portion 125.

Figure 20:
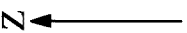
Figure 20:
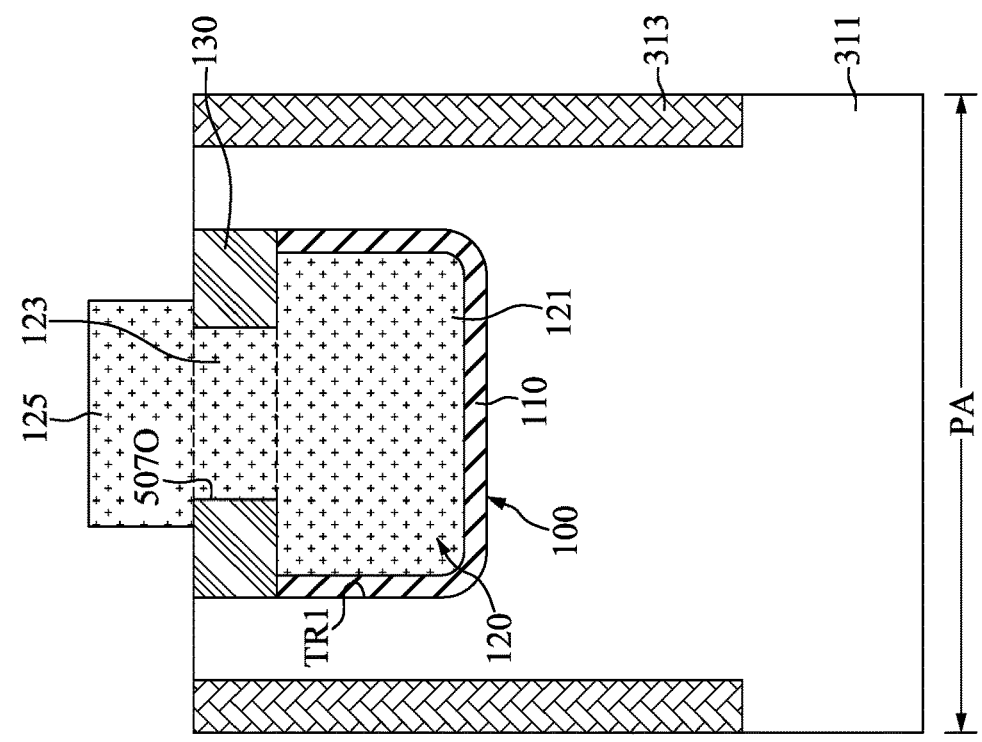
Figure 20:
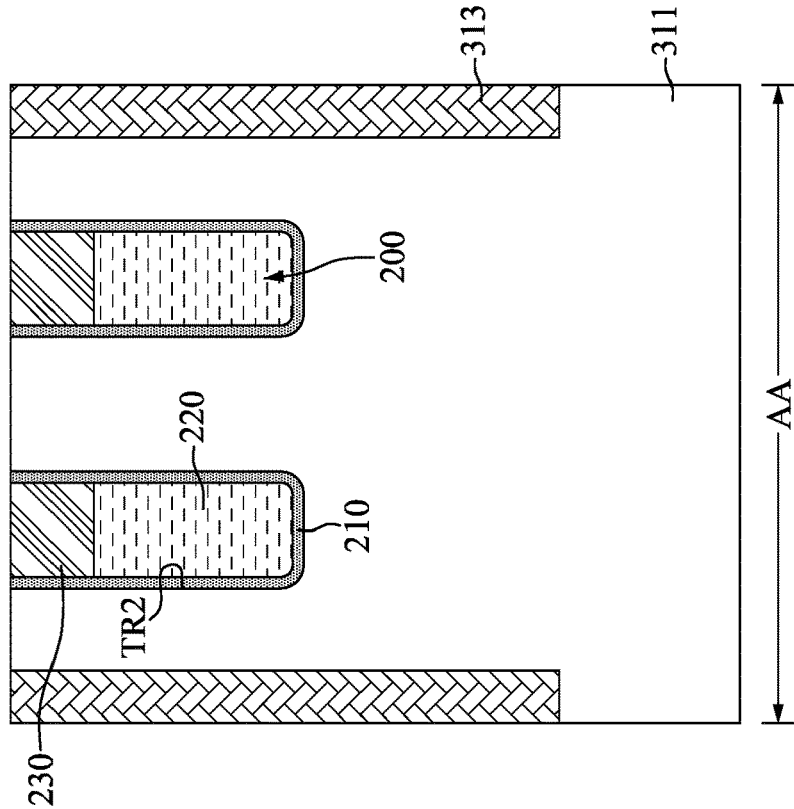

With reference to FIG. 20, the sacrificial layer 509 may be removed by an etch process. In some embodiments, the etch process may be an isotropic etch process. In some embodiments, the etch process may be a wet etch process or a dry etch process. In some embodiments, the etch rate ratio of the sacrificial layer 509 to the peripheral gate conductor 120 may be between about 100:1 and about 1.05:1, between about 15:1 and about 2:1, or between about 10:1 and about 2:1 during the etch process. In some embodiments, the etch rate ratio of the sacrificial layer 509 to the peripheral gate capping layer 130 (or the array gate capping layer 230) may be between about 100:1 and about 1.05:1, between about 15:1 and about 2:1, or between about 10:1 and about 2:1 during the etch process. In some embodiments, the etch rate ratio of the sacrificial layer 509 to the substrate 311 may be between about 100:1 and about 1.05:1, between about 15:1 and about 2:1, or between about 10:1 and about 2:1 during the etch process.

Figure 21:
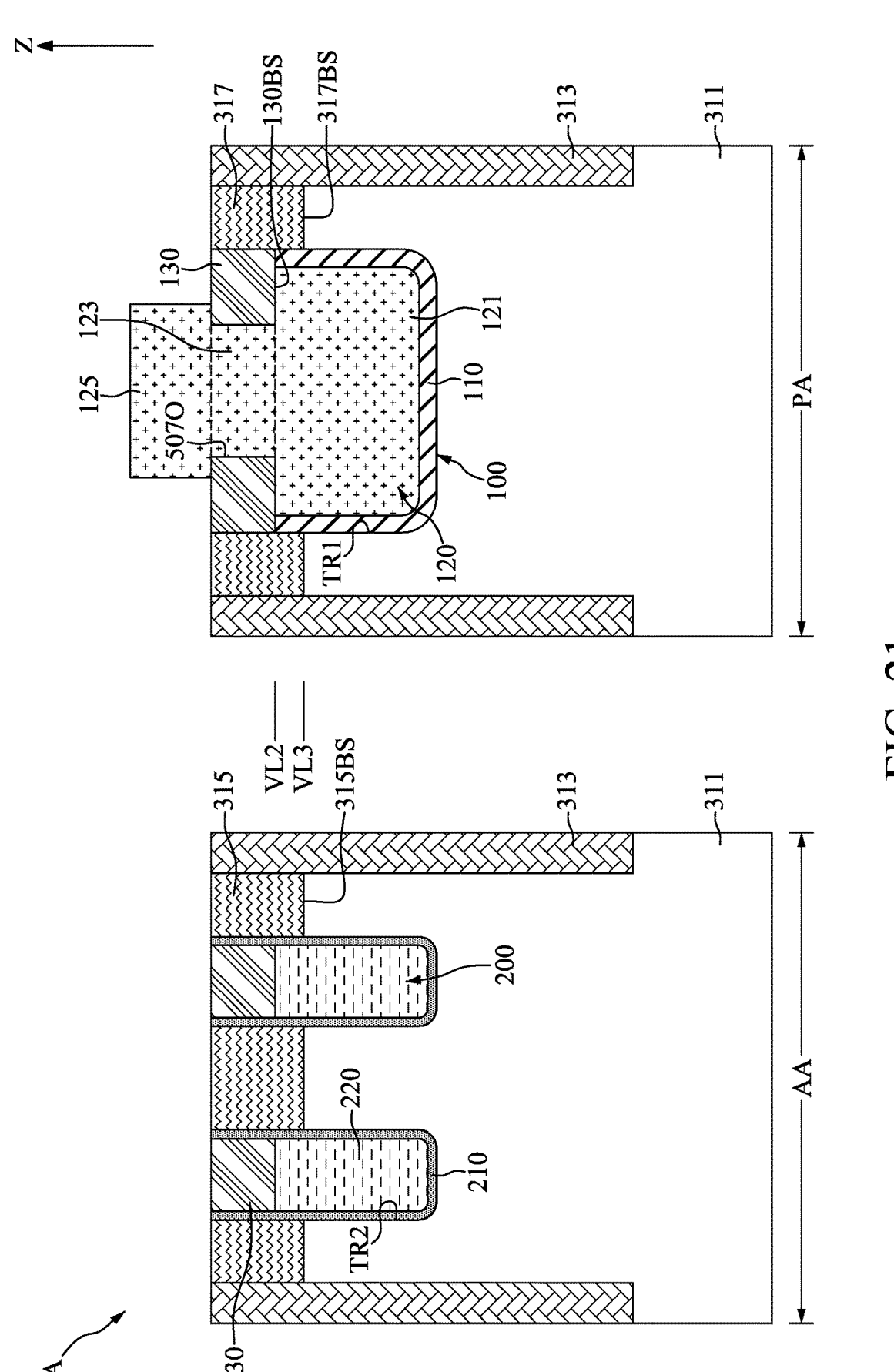

With reference to FIGS. 1 and 21, at step S17, a plurality of array impurity regions 315 may be formed in the array area AA of the substrate 311 and a peripheral impurity region 317 may be formed in the peripheral area PA of the substrate 311.

With reference to FIG. 21, the plurality of array impurity regions 315 and the plurality of peripheral impurity regions 317 may be formed by an implantation process using, for example, n-type dopants. The term "n-type dopant" refers to an impurity that when added to an intrinsic semiconductor material contributes free electrons to the intrinsic semiconductor material. In a silicon containing material, examples of n-type dopants include, but are not limited to, antimony, arsenic and/or phosphorus. In some embodiments, the concentration of dopants within the plurality of array impurity regions 315 and the plurality of peripheral impurity regions 317 may be in a range from $4 \times 10^{20}$ atoms/cm$^3$ to $2 \times 10^{21}$ atoms/cm$^3$; although other dopant concentrations that are lesser than, or greater than, the aforementioned range may also be employed in the present application. Alternatively, in some embodiments, the implantation process may use p-type dopants. The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium and/or indium.

In some embodiments, an annealing process may be performed to activate the plurality of array impurity regions 315 and the plurality of peripheral impurity regions 317. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

With reference to FIG. 21, the plurality of array impurity regions 315 may be formed in the array area AA of the substrate 311. The plurality of array impurity regions 315 may be formed between the plurality of array gate structures 200 and between the isolation layer 313 and the plurality of array gate structures 200. The top surfaces of the plurality of array impurity regions 315 and the top surface of the substrate 311 may be substantially coplanar. The plurality of peripheral impurity regions 317 may be formed in the peripheral area PA. The plurality of peripheral impurity regions 317 may be formed between the isolation layer 313 and the peripheral gate structure 100. The top surfaces of the plurality of peripheral impurity regions 317 and the top surface of the substrate 311 may be substantially coplanar.

With reference to FIG. 21, the bottom surfaces 315BS of the plurality of array impurity regions 315 and the bottom surface 317BS of the plurality of peripheral impurity regions 317 may be substantially coplanar at the vertical level VL3. In some embodiments, bottom surfaces 315BS of the plurality of array impurity regions 315 and the bottom surface 317BS of the plurality of peripheral impurity regions 317 may be at different vertical levels (not shown). In some embodiments, the bottom surface 317BS of the plurality of peripheral impurity regions 317 (or the bottom surface 315BS of the plurality of array impurity regions 315) may be at the vertical level VL3 lower than the vertical level VL2 of the bottom surface 130BS of the peripheral gate capping layer 130.

Figure 22:
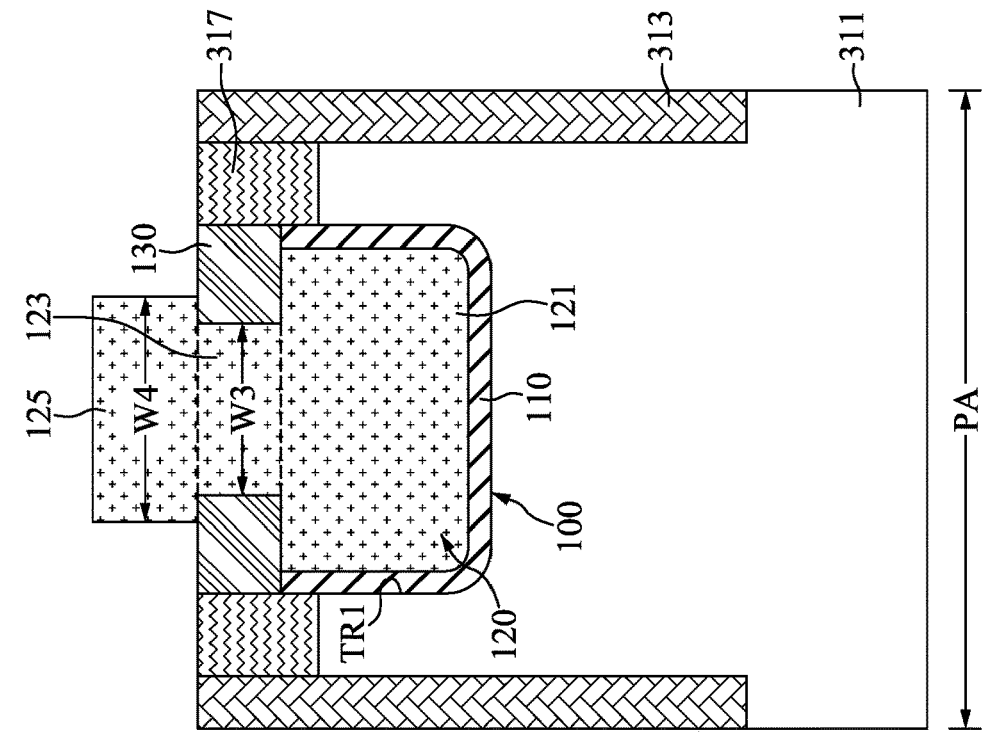
FIGS. 22 and 23 illustrate, in schematic cross-sectional view diagrams, semiconductor devices in accordance with some embodiments of the present disclosure.
Figure 22:
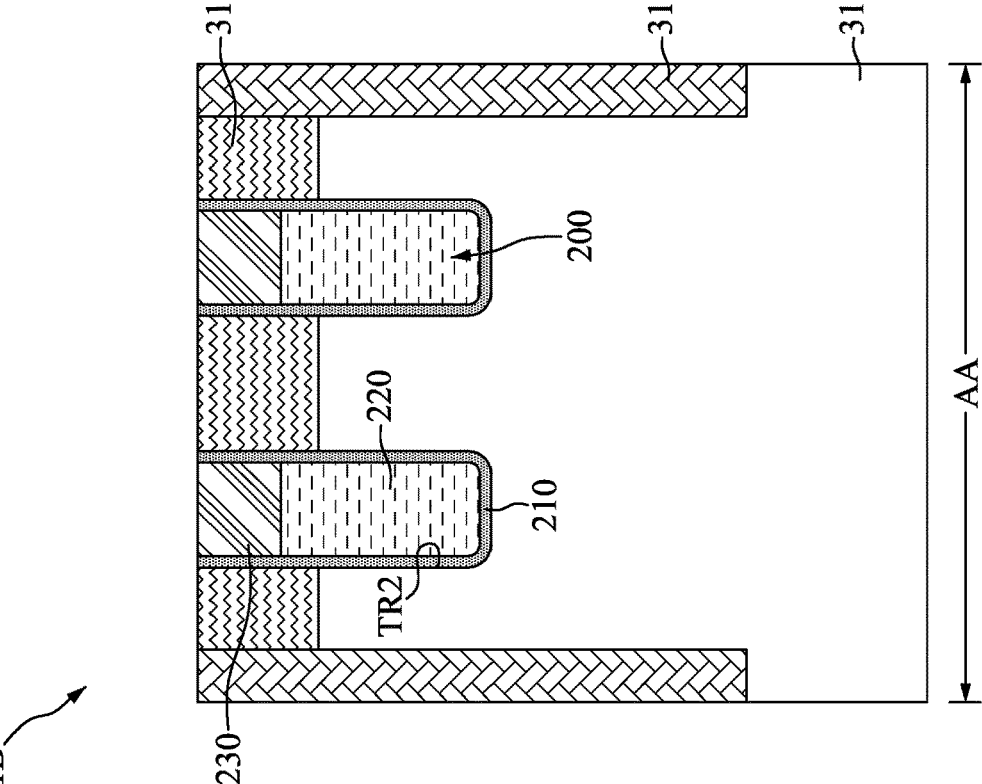
Figure 23:
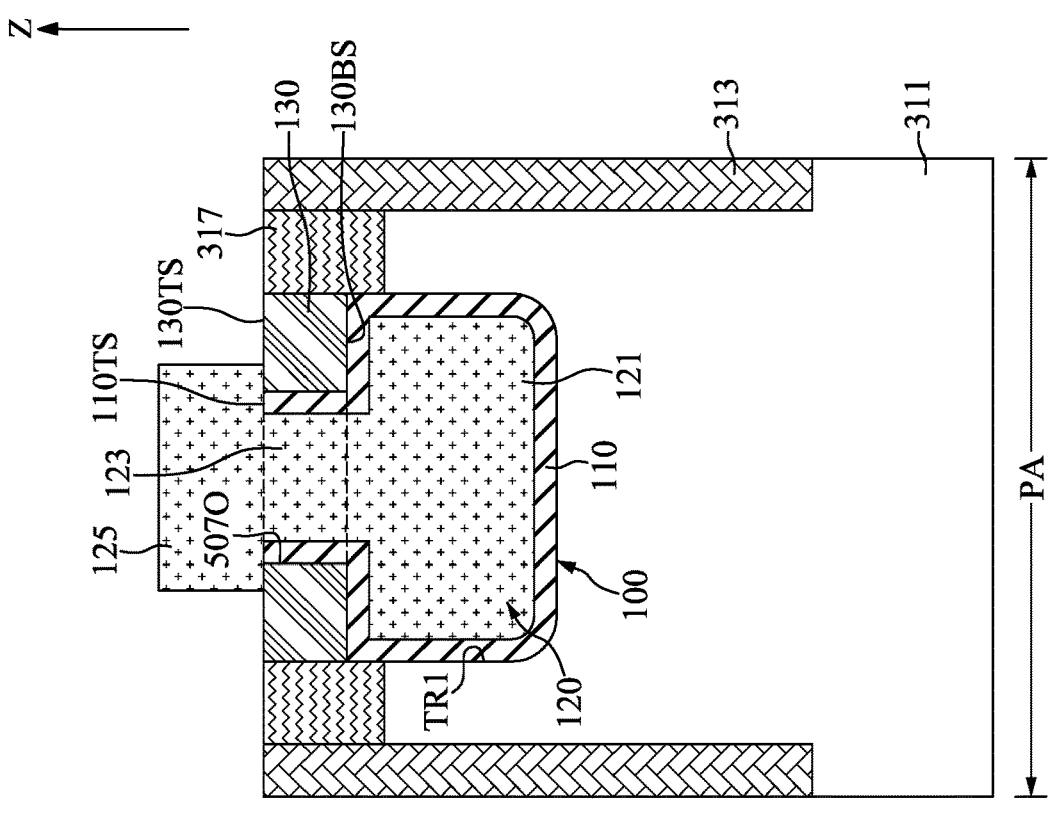
Figure 23:
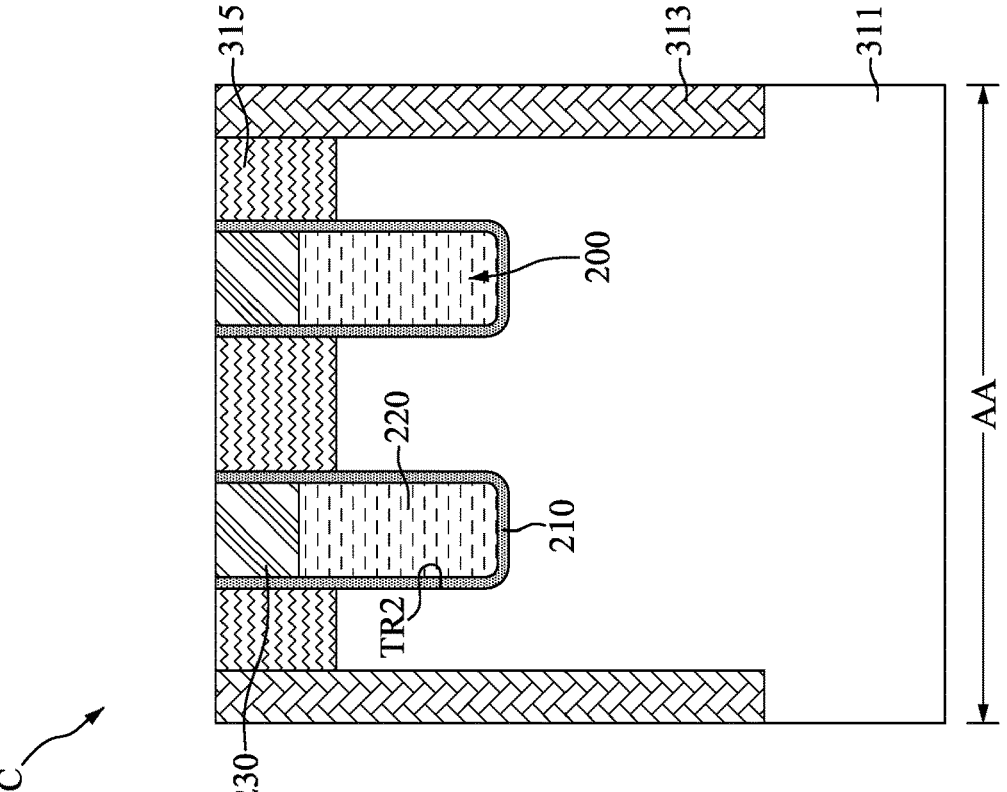

FIGS. 22 and 23 illustrate, in schematic cross-sectional view diagrams, semiconductor devices 1B and 1C in accordance with some embodiments of the present disclosure.

With reference to FIG. 22, the semiconductor device 1B may have a structure similar to that illustrated in FIG. 21. The same or similar elements in FIG. 22 as in FIG. 21 have been marked with similar reference numbers and duplicative descriptions have been omitted. In the semiconductor device 1B, the width W4 of the top portion 125 and the width W3 of the neck portion 123 may be substantially the same. In some embodiments, the width W4 of the top portion 125 may be less than the width W3 of the neck portion 123. In some embodiments, the width ratio of the width W4 of the top portion 125 to the width W3 of the neck portion 123 may be between about 0.9 and about 1.0 or between about 0.5 and about 1.0.

With reference to FIG. 23, the semiconductor device 1C may have a structure similar to that illustrated in FIG. 21. The same or similar elements in FIG. 23 as in FIG. 21 have been marked with similar reference numbers and duplicative descriptions have been omitted. In the semiconductor device 1C, the peripheral gate dielectric layer 110 may be disposed on the peripheral trench TR1, on the bottom surface 130BS of the peripheral gate capping layer 130, and on the opening 507O of the peripheral gate capping layer 130. The top surfaces 110TS of the peripheral gate dielectric layer 110 and the top surface 130TS of the peripheral gate capping layer 130 may be substantially coplanar. In the present embodiment, the peripheral gate dielectric layer 110 may be formed by, for example, atomic layer deposition.

Figure 24:
FIGS. 24 and 25 illustrate, in schematic cross-sectional view diagrams, part of a flow for fabricating the semiconductor device in accordance with another embodiment of the present disclosure.
Figure 25:

FIGS. 24 and 25 illustrate, in schematic cross-sectional view diagrams, part of a flow for fabricating the semiconductor device 1D in accordance with another embodiment of the present disclosure.

With reference to FIG. 24, an intermediate semiconductor device may be fabricated with a procedure similar to that illustrated in FIGS. 2 to 4, and descriptions thereof are not repeated herein. The peripheral trench TR1 may be deepened to a vertical level VL4 lower than the vertical level VL1 of the bottom surface TBS2 of the plurality of array trenches TR2.

With reference to FIG. 25, the peripheral gate structure 100, the plurality of array gate structures 200, the plurality of array impurity regions 315, and the plurality of peripheral impurity regions 317 may be formed with a procedure similar to that illustrated in FIGS. 5 to 21, and descriptions thereof are not repeated herein. The bottom surface TBS1 of the peripheral gate structure 100 may be at the vertical VL4 lower than the bottom surface TBS2 of the plurality of array gate structures 200.

One aspect of the present disclosure provides a semiconductor device including a substrate including an array area and a peripheral area; and a peripheral gate structure including: a peripheral gate dielectric layer inwardly positioned in the peripheral area of the substrate and including a U-shaped cross-sectional profile; a peripheral gate conductor including a bottom portion positioned on the peripheral gate dielectric layer and a neck portion positioned on the bottom portion; and a peripheral gate capping layer positioned on the peripheral gate dielectric layer and the bottom portion, and surrounding the neck portion. A top surface of the peripheral gate capping layer and a top surface of the neck portion are substantially coplanar.

Another aspect of the present disclosure provides a semiconductor device including a substrate including an array area and a peripheral area; a peripheral gate structure including: a peripheral gate dielectric layer inwardly positioned in the peripheral area of the substrate and including a U-shaped cross-sectional profile; a peripheral gate conductor including a bottom portion positioned on the peripheral gate dielectric layer and a neck portion positioned on the bottom portion; and a peripheral gate capping layer positioned on the peripheral gate dielectric layer and the bottom portion, and surrounding the neck portion; and an array gate structure positioned in the array area of the substrate. A top surface of the peripheral gate capping layer and a top surface of the neck portion are substantially coplanar. A width of the peripheral gate structure is greater than a width of the array gate structure.

Another aspect of the present disclosure provides a method for fabricating a semiconductor device including providing a substrate including an array area and a peripheral area; forming a peripheral trench in the peripheral area of the substrate and forming an array trench in the array area of the substrate; forming a dummy filler layer to completely fill the peripheral trench; recessing the dummy filler layer; forming an array gate structure in the array trench and forming a peripheral gate capping layer on the dummy filler layer and in the peripheral trench, wherein the peripheral gate capping layer includes a first opening exposing the dummy filler layer; forming a sacrificial layer on the substrate and forming a second opening along the sacrificial layer to expose the dummy filler layer; selectively removing the dummy filler layer in the peripheral trench; and forming a peripheral gate dielectric layer in the peripheral trench; forming a peripheral gate conductor on the peripheral gate dielectric layer, in the first opening, and in the second opening; and removing the sacrificial layer. The peripheral gate dielectric layer, the peripheral gate conductor, and the peripheral gate capping layer configure a peripheral gate structure.

Due to the design of the semiconductor device of the present disclosure, the peripheral gate structure 100 and the plurality of array gate structures 200 may be both formed in the substrate 311 by employing the dummy filler layer 501. The complexity of fabricating the semiconductor device 1A including the peripheral gate structure 100 and the plurality of array gate structures 200 may be reduced by employing the dummy filler layer 501. As a result, the cost of fabricating the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising an array area and a peripheral area;
a peripheral gate structure comprising:
    a peripheral gate dielectric layer inwardly positioned in the peripheral area of the substrate and comprising a U-shaped cross-sectional profile;
    a peripheral gate conductor comprising a bottom portion positioned on the peripheral gate dielectric layer and a neck portion positioned on the bottom portion; and
    a peripheral gate capping layer positioned on the peripheral gate dielectric layer and the bottom portion, and surrounding the neck portion; and
an array gate structure positioned in the array area of the substrate;

wherein a top surface of the peripheral gate capping layer and a top surface of the neck portion are substantially coplanar;
wherein a width of the peripheral gate structure is greater than a width of the array gate structure;
wherein the peripheral gate structure comprises a top portion positioned on the neck portion, and a width of the top portion and a width of the neck portion are substantially the same;
wherein the array gate structure comprising:
an array gate dielectric layer inwardly positioned in the array area of the substrate;
an array gate conductor positioned on the array gate dielectric layer; and
an array gate capping layer positioned on the array gate conductor;
wherein the peripheral gate dielectric layer and the array gate dielectric layer comprise different materials.

2. The semiconductor device of claim 1, wherein the peripheral gate conductor and the array gate conductor comprise different materials.

3. The semiconductor device of claim 2, further comprising a peripheral impurity region positioned in the peripheral area of the substrate and adjacent to the peripheral gate capping layer.

4. The semiconductor device of claim 3, wherein a bottom surface of the peripheral impurity region is at a vertical level lower than a bottom surface of the peripheral gate capping layer.

5. A semiconductor device, comprising:
a substrate comprising an array area and a peripheral area;
a peripheral gate structure comprising:
    a peripheral gate dielectric layer inwardly positioned in the peripheral area of the substrate and comprising a U-shaped cross-sectional profile;
    a peripheral gate conductor comprising a bottom portion positioned on the peripheral gate dielectric layer and a neck portion positioned on the bottom portion; and
    a peripheral gate capping layer positioned on the peripheral gate dielectric layer and the bottom portion, and surrounding the neck portion; and
an array gate structure positioned in the array area of the substrate;
wherein a top surface of the peripheral gate capping layer and a top surface of the neck portion are substantially coplanar;
wherein a width of the peripheral gate structure is greater than a width of the array gate structure;
wherein the peripheral gate structure comprises a top portion positioned on the neck portion, and a width of the top portion and a width of the neck portion are substantially the same;
wherein a bottom surface of the peripheral gate structure is at a vertical level lower than a bottom surface of the array gate structure.

* * * * *